United States Patent [19]
Doi et al.

[11] Patent Number: 5,462,922
[45] Date of Patent: Oct. 31, 1995

[54] SUPERCONDUCTIVE MATERIAL, A SUPERCONDUCTIVE BODY, AND A METHOD OF FORMING SUCH A SUPERCONDUCTIVE MATERIAL OR BODY

[75] Inventors: Toshiya Doi; Takeshi Ozawa; Kazuhide Tanaka; Toyotaka Yuasa, all of Hitachi; Tomoichi Kamo; Shinpei Matsuda, both of Toukai, all of Japan

[73] Assignee: Hitachi, Ltd., Tokyo, Japan

[21] Appl. No.: 858,711

[22] Filed: Mar. 27, 1992

[30] Foreign Application Priority Data

Mar. 29, 1991 [JP] Japan .................................. 3-066001
Jun. 24, 1991 [JP] Japan .................................. 3-151337

[51] Int. Cl.$^6$ .......................... H01B 12/00; H01L 39/12
[52] U.S. Cl. .................... 505/785; 505/100; 505/704; 505/740; 505/783; 252/518; 252/521; 252/785
[58] Field of Search ................................. 252/518, 521; 505/785, 704, 740, 783–785

[56] References Cited

U.S. PATENT DOCUMENTS

| | | | |
|---|---|---|---|
| 4,826,808 | 5/1989 | Yurek .......................................... | 505/1 |
| 4,952,554 | 8/1990 | Jin ............................................... | 505/740 |
| 5,017,554 | 5/1991 | Subramanian ............................ | 505/783 |
| 5,057,484 | 10/1991 | Shiota ....................................... | 505/704 |
| 5,093,314 | 3/1992 | Takahashi ................................. | 505/704 |

(List continued on next page.)

OTHER PUBLICATIONS

Ginley et al. "Sequential electron beam evaporated films of $Tl_2CaBa_2Cu_2O_y$ . . . " Appl. Phys. Lett. 53(5) Aug. 1, 1988 pp. 406–408.
Fang et al. "Critical currents of aligned grains of Tl–Ba–Ca–Cu–O . . . " Cryogenics, vol. 29 Mar. 1989 pp. 347–349.
Doi "Flux pining in single Tl-layer 1223 superconductors" Physica C vol. 183 Nov. 10, 1991 pp. 67–72.
Kamo "Introduction of pinning centers into Tl–(1223) . . . " Appl. Phys. Lett. vol. 59(24) Dec. 9, 1991 pp. 3186–3188.
Ekin "Transport critical current in bulk sintered $Y_1Ba_2Cu_3O_x$. . . " Adv. Cer. Matl's vol. 2(3B) Special Issue Jul. 1987 pp. 586–592.
Liu "A new high–$T_d$ superconducting Tl–Pb–Ca–Sr–Cu–O System" Physica C vol. 156 1988 pp. 791–794.
Ganguli "Novel series of thallium cuprate superconductors" Physica C. 162–164 1989 pp. 867–868.
Shi "Flux pinning by precipitates in the Bi–Sr–Ca–Cu–O System" Physical Review B vol. 40(7) Sep. 1, 1989 pp. 5255–5258.
Yamada "Pb introduction to the high–Tc superconductor Bi–Sr–Cn–Cu–O" Jap. Jnl. Appl. Phys. vol. 27(6) Jun. 1988 pp. L996–L998.Structural Peculiarities of the "1212" superconductor Martin, et al. 1989.
Bulk Superconductivity up to 122K in the Tl–Pb–Sr–Ca–Cu–O System, Subramanian, et al. Oct. 1988.

Primary Examiner—Paul Lieberman
Assistant Examiner—M. Kopec
Attorney, Agent, or Firm—Antonelli, Terry, Stout & Kraus

[57] ABSTRACT

A superconductive material has the formula

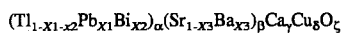

$(Tl_{1-x1-x2}Pb_{x1}Bi_{x2})_\alpha(Sr_{1-x3}Ba_{x3})_\beta Ca_\gamma Cu_8 O_\zeta$ where
$0 \leq X1 \leq 0.8$
$0 \leq X2 \leq 0.5$
$0 \leq X3 \leq 1.0$
$0.7 \leq \alpha \leq 1.5$
$1.4 \leq \beta \leq 3.0$
$0.7 \leq \gamma \leq 4.5$
$1.4 \leq \delta \leq 6$
$4.5 \leq \zeta \leq 17$
$0 < X1+X2 < 1$.

The superconducting material may be combined with an isostructural non-superconducting material, which then acts as a pinning center. The result may also be combined with a metal. The resulting superconductor permits a high critical current density Jc to be obtained, even at relatively high magnetic flux densities.

15 Claims, 3 Drawing Sheets

U.S. PATENT DOCUMENTS

| | | | |
|---|---|---|---|
| 5,106,825 | 4/1992 | Mandigo | 505/740 |
| 5,149,687 | 9/1992 | Galasso | 505/783 |
| 5,173,475 | 12/1992 | Takada | 505/782 |
| 5,192,739 | 3/1993 | Lay | 505/740 |
| 5,300,482 | 4/1994 | Doi et al. | 505/120 |

SUPERCONDUCTIVE MATERIAL, A SUPERCONDUCTIVE BODY, AND A METHOD OF FORMING SUCH A SUPERCONDUCTIVE MATERIAL OR BODY

BACKGROUND OF THE INVENTION

1. Field of the Invention

The present invention relates to a superconducting material, to a superconducting body, and to a method of making such a superconducting material or body.

2. Summary of the Prior Art

Superconducting materials are now well know, and many different superconducting materials have been disclosed.

For example, U.S. Pat. No. 4,990,432 disclosed superconductive materials based on the elements Bi, Sr, Cu, O. In U.S. Pat. No. 4,990,432, the materials proposed had the composition $Bi_aSr_bCu_cO_d$, where $a+b+c=1$, $a=0.36$–$0.557$, $b=0.098$–$0.496$, $c=0.1$–$0.4$ and $d=$approx. $1+a/2$ Furthermore, JP-A-2-289424 disclosed superconductive materials based on the elements Tl, Sr, Ca, Cu, O, and Tl Ba/Sr, Ca, Cu, O. Again, specific ranges were given for the amounts of those elements present in the material. U.S. Pat. No. 5,017,554 disclosed superconductive compounds based on Tl/Pb, Sr, Ca, Cu, O. The disclosure proposed the material $Tl_ePb_aCa_bSr_cCu_dO_x$ with $a=1/10$–$3/2$, $b=1$–$4$, $c=1$–$3$, $d=1$–$5$, $e=3/10$–$1$ and $x=(a+b+c+d+e+y)$, with $y=1/2$–$3$.

An article entitled "A New Process with the Promise of High Jc on Oxide Superconductors" by M Murakami et al in Japanese Journal of Applied Physics, Vol 28, No. 7, pp 1189 to 1194 (1989) also disclosed superconductive materials based on Y, Ba, Cu, O together with non-superconductive material based on x, Y, Ba, Cu, O.

SUMMARY OF THE INVENTION

There are two things that need to be considered when producing a superconductive material. The first is the critical temperature Tc which is the temperature above which the superconductive material ceases to exhibit superconductive properties. Superconductive oxides have been developed with relatively high Tc (100 K. or greater), but attempts continue to be made to increase Tc.

In the search for superconductive materials of high Tc, however, little consideration has been given to the current density that is obtainable in the presence of a magnetic field. The current density of which the superconductive effect is lost is known as the critical current density Jc, and, in general, existing superconductive materials show a significant drop in critical current density Jc in the presence of relatively small magnetic fields. There is this a desire to increase the critical density Jc in general, and in particular to increase that critical current density Jc in the presence of a magnetic field.

In a first aspect of the present invention, it is proposed that a superconductive material be formed of the formula:

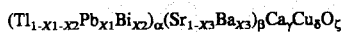

where
$0 \leq X1 \leq 0.8$
$0 \leq X2 \leq 0.5$
$0 \leq X3 \leq 1.0$
$0.7 \leq \alpha \leq 1.5$
$1.4 \leq \beta \leq 3.0$
$0.7 \leq \gamma \leq 4.5$
$1.4 \leq \delta \leq 6$
$4.5 \leq \zeta \leq 17$
$0 < X1+X2 < 1$ This formula will be referred to as Formula 1. Preferably $0 < X3 \leq 1$ It has been found that such a superconductive material permits high critical current density Jc to be achieved, particularly at high magnetic fields. For example, the existing materials described in U.S. Pat. No. 4,994,432 and JP-A-2-289424 all have a critical current density Jc which falls to zero at a magnetic field of 1 Tesla, whereas the present invention may permit critical current densities of around 1000 A/cm$^2$ and magnetic fields of the order of 8 Tesla.

Furthermore, superconductive materials according to the first aspect of the present invention generally have values of the critical temperature Tc of a similar order to those materials disclosed in U.S. Pat. Nos. 4,994,432, 5,017,554 and JP-A-2-289424. Thus, the advantages of high critical current density Jc achievable by superconductive materials of the present invention do not involve significant loss of critical temperature Tc.

| Preferably, either: | $1.4 \leq \gamma \leq 3$ |
| --- | --- |
|  | $2.1 \leq \delta \leq 4.5$ |
|  | $6.0 \leq \zeta \leq 14.0$ |
| or: | $0.7 \leq \gamma \leq 1.5$ |
|  | $1.4 \leq \delta \leq 3$ |
|  | $4.5 \leq \zeta \leq 11.0$ |
| or: | $2.1 \leq \gamma \leq 4.5$ |
|  | $2.8 \leq \delta \leq 6$ |
|  | $7.4 \leq \zeta \leq 17.0$ |
| or: | $0.3 \leq X1 \leq 0.6$ |
|  | $0 \leq X2 \leq 0.2$ |
|  | $0.1 \leq X3 \leq 0.5$ |

When an oxide superconductive material, is cooled to an appropriate temperature, is made superconductive and is maintained in a magnetic field, the quantized magnetic flux enters the superconductive material. If applying current is applied under this condition to the superconductive material, Lorentz force will act on the magnetic flux, causing the magnetic flux to move in the superconductive material. The movement of the magnetic flux causes loss of energy, which, in turn, causes electric resistance to occur in the superconductive material. Therefore, to obtain high critical current density Jc in the magnetic field, it is necessary to ensure that the magnetic flux having entered the superconductive material does not move even when the current is flowing. It is known, eg from the article by M Murakami referred to above, to introduce non-superconductive material into the superconductive material into the superconductive material matrix, into the superconductive material matrix, and the quantized magnetic flux is trapped in by these non-superconductive materials (the non-superconductive materials act as pinning centers) so that the entered magnetic flux will not move, thereby ensuring that the current will flow without resistance occurring even in a magnetic field.

Therefore, it is possible to introduce a plurality of pinning centers into the superconductive material of the first aspect of the present invention, to form a superconductive body.

However, investigations have shown that particularly advantageous results are achieved when the pinning centers are formed by a non-superconductive material which is isostructural with the superconductor material An isostructural material is one with the same chemical structure, but has at least one element difference. Therefore, a second aspect of the present invention proposes that a superconductive body comprises at least one superconductive material and at least one isostructural non-superconductive material differing by one or more element.

It is found that the use of such isostructural non-superconductive material also acts to improve the critical current density Jc in the presence of a magnetic field. Preferably the superconductive material is the oxide superconductive material $(Tl_{1-X1-X2}Pb_{X1}Bi_{X2})Sr_{1-X3}Ba_{X3})_2CaCu_2O_{7+X4}$, (where $0 \leq X1 < 0.8$, $0 \leq X2 < 0.5$, $0 \leq X3 < 1$ $0 < X1+X2 < 1$, and $-0.5 < X4 < 0.5$) and the non-superconductive material is $(Tl_{1-X1-X2}Pb_{X1}Bi_{X2})Sr_{1-X3}Ba_{X3})_2LnCu_2O_{7+X4}$, (where Ln is a yttrium or one or more of the elements selected from the rare earth elements, and $-0.5 < X4 < 0.5$) and/or $(Tl_{1-X1-X2}Pb_{X1}Bi_{X2})LnSrCaCu_2O_{7+X4}$, (where Ln is an yttrium or one or more of the elements selected from the rare earth elements, and $-0.5 < X4 < 0.5$) having a crystalline structure isostructural with that of the superconductive material, obtained by substituting the other elements for one or more elements constituting the superconductive material.

In a further development, the oxide superconductive material is $(Tl_{1-X1-X2}Pb_{X1}Bi_{X2})Sr_{1-X3}Ba_{X3})_2CaCu_2O_{7+X4}$, (where $0 \leq X1 < 0.8$, $0 \leq X2 < 0.5$, $0 < X3 \leq 1$, $0 < X1+X2 < 1$, and $-0.5 < X4 < 0.5$), the non-superconductive material is $(Tl_{1-X1-X2}Pb_{X1}Bi_{X2})Sr_{1-X3}Ba_{X3})LnCu_2O_{7+X4}$, (where Ln is yttrium or one or more of the elements selected from the rare earth elements, and $-0.5 < X4 < 0.5$) and/or $(Tl_{1-X1-X2}Pb_{X1}Bi_{X2})LnSrCaCu_2O_{7+X4}$, (where Ln is yttrium or one or more of the elements selected from the rare earth elements, and $-0.5 < X4 < 0.5$) having a crystalline structure isostructural with that of the superconductive material, obtained by substituting the other elements for one or more elements constituting the superconductive material, and there is also a metallic part of e.g. Ag and/or Pt family metals.

As is evident from the above discussion, the present invention is particularly concerned with superconductive materials containing Tl. As was mentioned earlier, with reference to the article by M Murakami, it is known to provide semiconductor comprising compounds of Y, Ba, Cu, O and non-isostructural materials forming a pinning center. However, such materials have critical temperatures C. below 100 K. Therefore, a further aspect of the present invention proposes that a semiconductor body be formed of a Tl-based superconducting material together with non-superconducting material which may be isostructural or non-isostructural with the superconductive material.

A further aspect of the present invention concerns the method used to form the superconductive material or superconductive body. According to this aspect of the present invention, it is preferable that the superconductive material is subjected to a melt process. Where a superconductive body is to be formed from a superconductive material and a non-superconductive material, particles of the two materials are mixed, sintered, and then subject to the melt process.

Superconductive materials and/or superconductive bodies according to the present invention are particularly advantageous for forming superconductive wires. This is particularly true if the superconductive body contains suitable metallic material, e.g. Ag and/or Pt family metals, as has been mentioned earlier.

BRIEF DESCRIPTION OF THE DRAWINGS

Embodiments of the present invention will now be described, by way of example, with reference to the accompanying drawings, in which.

DETAILED DESCRIPTION OF THE INVENTION

Figure 1:
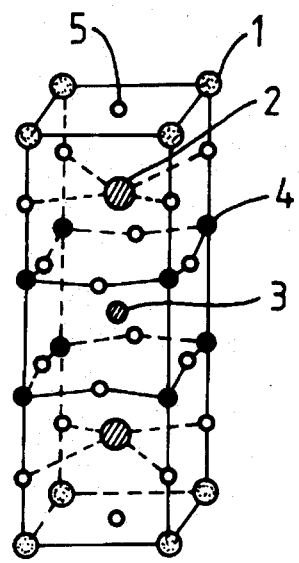
FIG. 1 shows a model representing the crystal structure of a superconductive material produced according to Embodiment 1 of the present invention.

When an oxide high-temperature superconductive material, being a second-grade superconductor, is cooled to an appropriate temperature, made superconductive, and maintained in a magnetic field, quantized magnetic flux enters the superconductive material. If an electric current is then applied to the superconductive material, Lorentz force will act on the magnetic flux, causing the magnetic flux to move in the superconductive material. The movement of the magnetic flux causes loss of energy, which, in turn, causes electric resistance to occur in the superconductive material. Therefore, to obtain a higher superconductive critical current density (hereinafter referred to as "Jc") in the magnetic field, it is necessary to ensure that the magnetic flux which has entered the superconductive material does not move even when a current is flowing. It is known to introduce non-superconductive material into the superconductive material matrix, and the quantized magnetic flux is trapped in this portion (the portion act as a "pinning center") so that the magnetic flux will not move, thereby ensuring that the current will flow without resistance occurring even in a magnetic field. The present invention then seeks a superconductor which permits a large amount of superconductive current to flow, even in a magnetic field, and using an oxide high-temperature superconductive material. It has been found that a large amount of superconductive current can flow even in a magnetic field by heat-treating a superconductor of a suitable composition at a temperature range in which a liquid phase is created at least once.

A pinning center is a portion which traps the quantized magnetic flux entering the superconductive material and fixes the magnetic flux so that resistance will not occur when the magnetic flux is moved. If non-superconductive material is present in a matrix of superconductive materials, the non-conductive portion has smaller energy for the quantized magnetic flux at the temperature at which the superconductive materials shift into the superconductive phase (hereinafter referred to as the critical temperature "Tc"). Thus, the presence of the magnetic flux takes priority over that of the non-conductive portion. Hence, all the non-conductive portions introduced into the matrix of superconductive materials have a possibility of becoming pinning centers. However, the force to fix the quantized magnetic flux (pinning force) varies greatly according to the type of the materials of the pinning center, size, shape and distribution of the non-conductive portion, distance between the non-conductive portions, and boundary bondage between the superconductive and non-superconductive materials.

In embodiments of the present invention, it has been found to be possible to manufacture a superconductor featuring a high degree of pinning force, that is, a high value of superconductive critical current density "Jc" even in a magnetic field, by maintaining the superconductor comprising a superconductive material consisting of Tl, Sr, Ca, Cu and O at a temperature range, for five minutes or more, where a liquid phase is once created, and by subsequently heat-treating it at the temperature of 800° to 900° C. It has also been found that the value of "Jc" in the magnetic field may exceed 1000 A/cm$^2$ at 77 K. and one tesla when the non-superconductive material comprising Ca, Cu and O, non-superconductive material comprising Ca, Sr and O, and non-superconductive material containing elements constituting the superconductive materials such as CaO and CuO are present within a range of 10 to 60 percent in volume ratio, in addition to the superconductive material.

The composition ratio of the starting (original) materials has been investigated, on the basis of many different parameters, and it has been found that the composition of the superconductive materials contained in the superconductors is preferably as will now be described.

Though there are variations amounting to tens of percent, depending on the crystals analyzed, the approximate composition of the superconductor is preferably;

Tl:Sr:Ca:Cu:O=1:2:1:2

Tl:Sr:Ca:Cu:O=1:2:2:3

Tl:Sr:Ca:Cu:O=1:2:3:4

To facilitate production of the superconductive material, various substitution of the elements has been investigated. By substituting Bi or Pb for part of the Tl and, at the same time, substituting Ba for part of Sr, it was possible to come close to a composition suited to the production process, and to improve the value of "Jc" in the magnetic field for the superconductor manufactured via a process of in which the liquid phase is generated once. Bi or Pb was substituted for part of the Tl in the conventional method as well.

It is known that the material represented by Formula 2 is a superconductive material; Formula 2

(Tl, Pb, Bi)Sr$_2$Ca$_{n-1}$Cu$_n$O$_{2n+3}$     (Formula 2)

However, when the Ba does not substitute for part of the Sr, the temperature for creation of liquid phase is as high as 950° C. when heat-treatment is performed to allow partial coexistence of liquid phase as described above. Therefore, a large amount of Tl evaporates during this process, which makes it difficult to manufacture the superconductor. By substituting Bi or Pb for part of the Tl and, at the same time, substituting Ba for part of Sr, the temperature for generating the liquid phase component is lowered and evaporation of the Tl is reduced. Therefore, the superconductor is preferably manufactured by such a process. This permits production of a superconductor featuring a high value of Jc in a magnetic field.

It has also been found that the bondage of the crystal grain is improved by substituting Bi or Pb for part of the Tl and, at the same time, Br for part of the Sr.

When a superconductor mainly comprising the elements represented in Formula 2, was manufactured by a normal heat treatment method without generating the liquid phase, then the superconductive critical current density inside the crystal grain of the superconductor was thousands of A/cm$^2$ (at an applied magnetic field of one tesla and measuring temperature of 77 K.), which was unsatisfactory. Furthermore, the conventional composition and conventional heat treatment brings about not only unsatisfactory superconductive critical current density "Jc", but also extremely poor bondage among the crystal grains of the superconductive materials. The value of the superconductive current flowing through the boundary of this crystal grain is one tenth or less of the superconductive critical current density inside the crystal grain. Thus, the superconductive current flowing as carrying current is extremely low, for example, hundreds of A/cm$^2$ at the temperature of 77 K. in an applied magnetic field of one tesla.

When the superconductor was manufactured by heat-treating the superconductor comprising the superconductive material obtained by substituting the Bi or Pb for part of the Tl and, at the same time, the Ba for part of the Sr as main crystal, at least once at the temperature range which allows coexistence of the liquid phase component, then the superconductive critical current density "Jc" within the crystal grain of the superconductor was sufficiently high, namely, tens of thousands of A/cm$^2$ (in an applied magnetic field of one tesla at the temperature of 77 K.). The bondage among the crystal grains of the superconductive material was excellent, and the superconductive current which could flow the boundary was one tenth or more. Hence, the value of the superconductive current which can flow as carrying current was extremely high, e.g. thousands to tens of thousands of A/cm$^2$ at a temperature of 77 K. in an applied magnetic field of one tesla.

In such a case, a superconductor with such non-superconductive materials as BaPbO$_3$, BaBiO$_3$, Ca$_2$CuO$_3$, and Ca$_2$PbO$_4$ present in addition to the superconductive material showed a superconductive critical current density "Jc" ten to twenty percent higher than a superconductor without those materials. It was not possible to get evidence that these non-superconductive materials were working as pinning centers, but there is a great probability for that. The diameter of the crystal grain of the superconductive material was adjusted, and the triple point of the grain boundary was dispersed uniformly by controlling the distribution of the triple point (average distance: 10 microns); this resulted in an improvement of the value of "Jc" in the magnetic field by ten percent. Assuming that this triple point was working as a pinning center, the distribution was examined by computer simulation, and it was found that the average distance should preferably be 10 nm to 50000 nm.

The process of manufacturing a superconductor featuring a high "Jc" value in a magnetic field may be facilitated by manufacturing the superconductor with a composition which contains, in addition to the superconductive material and non-superconductive material, a metal which does not react significantly with the superconductive and non-superconductive material at the temperature for manufacturing the materials. The metal parts should be distributed uniformly throughout, and the volume ratio should be 50 percent or less; more preferably 20 percent or less.

Considering now the ratio between the superconductive material and non-superconductive material constituting the superconductor, a smaller percentage of the non-superconductive material will result in a smaller pinning force in total, giving a smaller value of "Jc" in the magnetic field. Conversely, a greater percentage of the non-superconductive material will mean a smaller percentage of the superconductive portion, which does not provide high "Jc". Thus, the ratio between the oxide superconductive material and non-superconductive material in terms of volume ratio should be within a suitable range, preferably from 0.01 to 1.

When current is applied to the superconductor using an oxide superconductive material of a polycrystalline substance, the superconductive critical current density "Jc" of the superconductor juncture at the grain boundary is generally lower than that of the superconductive state within the crystal grain; thus, presence of the non-superconductive material within the crystal grain is more effective than presence on the grain boundary of the superconductive material, when it is sought to ensure a high value of "Jc" for the superconductor.

When the ratio between the non-superconductive material separated inside the crystal grain of the superconductor and the superconductive material is considered, a smaller percentage of the non-superconductive material will result in a smaller pinning force in total, giving a smaller value of "Jc" in the magnetic field. Conversely, a greater percentage of the non-superconductive material means a smaller percentage of the superconductive material, which does not provide high "Jc". Thus, again the ratio of the superconductive material and non-superconductive material should be within a suitable range. Preferably, the volume ratio of the non-superconductive material with respect to the oxide superconductive material should range from 0.01 to 10, more preferably from 0.01 to 1. If the non-superconductive material separated inside the crystal grain of the superconductor is too small in size, quantized magnetic flux cannot be sensed as an energy well, so that it fails to function as a pinning center. Excessive size of the non-superconductive material will produce a flat energy well, causing a poor pinning center function, and lowering the value of "Jc". Thus, the size of the non-superconductive material grains should be within a suitable range. The average particle size of the non-superconductive material should normally range from 1 nm to 1 micron, more preferably from 1 nm to 0.5 microns. Quantized magnetic fluxes which enter the superconductor react with each other; so the distribution density of the pinning centers within the superconductor is also significant in determining the Jc value in the magnetic field. The average distance between the crystal grains of the non-superconductive materials should range from 1 nm to 1 microns, more preferably from 1 to 300 nm.

When the percentage of Tl and Pb contained in the material is considered, matching between the superconductive material and non-superconductive material appears to be the most effective when the X1 value in Formula 1 is 0.3 to 0.8; a higher Jc value is obtained. The superconductive critical current density of the superconductors manufactured in the said six cases were measured at the temperature of 77 K. in the magnetic field of 1 tesla. The values obtained were at least 5000 A/cm$^2$ in all cases.

When manufacturing the superconductors, it is desirable to allow the superconductors to reach the temperature range in which the liquid phase will be generated at least once, in order to disperse the pinning centers uniformly. To remove harmful materials from the crystal grain boundaries of the superconductive material and non-superconductive material, it is desirable, at least once, to provide heat treatment within a range from a temperature equal to or above the temperature 50 degrees lower than the temperature at which the liquid phase begins to be generated, to a temperature equal to or below the temperature at which all components are in a liquid phase.

The "Jc" value can be further improved in a magnetic field by separating the different non-superconductive materials acting as pinning centers inside the superconductor.

Many non-superconductive materials (non-superconductive materials G) have been introduced into the superconductor, e.g. by introducing a non-superconductive material (A) having crystal structure isostructural (hereinafter "similar") to that of the superconductive material, the non-superconductive material being obtained by substituting different elements for one or more elements of the superconductive material into the matrix of the oxide superconductive material, in an effort to find out what kind of other non-superconductive materials are suited as materials to form the pinning centers. As a result, it has been found that the oxide superconductive material, or the material consisting only of the elements which constitutes the non-superconductive material (A) is effective. In particular, $CaO$, $SrO$, $Ca_2CuO_3$, $Ca_2PbO_4$, $BaPbO_3$ and $BiBaO_3$ have been found effective. If the process of manufacturing superconductors according to the present invention uses a step which makes said oxide superconductive material and non-superconductive material (A) amorphous, and the materials are subsequently crystallized by heat treatment, then bonding of the crystal grains of the superconductive material improves, ensuring the production of superconductors with excellent properties. To make such materials amorphous, an abrupt quenching method (to cool these materials abruptly from the liquid phase), spattering method, laser deposition method, electron beam deposition method, deposition method, thermal spraying method, chemical vapor phase deposition, etc. may be used with successful results.

A superconductor according to the present invention is applicable to all the superconductor-applied equipment, which currently use a superconductor or which are supposed to be able to use a superconductor. The superconductor manufacturing method according to the present invention is directly applicable to the manufacture of a superconductive wire using an oxide superconductor.

As described above, in order to improve the value of the superconductive critical current density "Jc" of the superconductor using an oxide superconductive material in a magnetic field, it is necessary to introduce pinning centers which effectively fix the quantized magnetic flux entering the superconductor.

The pinning centers do not have superconductivity. If the non-superconductive material of the pinning center contained in the superconductor is excessive, the superconductive current path will decrease, resulting in a superconductor with a low Jc value in total. Thus, the quantity of pinning centers to be introduced into the superconductor must be within a certain range. The volume ratio of the pinning centers relative to the oxide superconductive material must normally be 0.01 to 10.

The magnetic flux entering the superconductor is quantized and is very small in size. Its diameter is of the same order as that of the superconductor coherence length. Thus, the most effective situation is when the size of the pinning center is about the same as the superconductor coherence length. Generally, the coherence length of the oxide superconductive material is from several angstroms to scores of angstroms. Therefore, when the non-superconductive material particles present inside the superconductor, acting as the pinning centers, have about this size, the pinning centers work more effectively. The triple point is structured in size to be extremely effective as a pinning center. Actually, the quantized magnetic fluxes can enter the pinning centers in several bundles, so the size of the non-superconductive material particles present inside the superconductor acting as the pinning centers is considered to be effective when it is within the range from several angstroms to thousands of angstoms. The size should preferably be within the range from 3 angtroms to 1 micron. The quantized magnetic fluxes entering the superconductor have a mutual effect of repelling each other; therefore the distribution density of the pinning centers in the superconductor has a significant influence on the "Jc" value in the magnetic flux. The average distance between the crystal grains of the non-oxide superconductive material should preferably be within the range from 1 nm to 1 micron. It should more preferably be within the range from 1 to 300 nm.

When manufacturing a superconductor according to the present invention, it is preferable that heat treatment is performed with the liquid phase coexisting. Coexistence of the liquid phase increases the speed of atomic dispersion, resulting in improved crystal properties of the materials of the superconductor and in better bondage between the crystal grains. At the same time, if the superconductive material used in the present invention is maintained at the temperature range for generating the liquid phase, the superconductive material will start to decompose and the resulting non-superconductive material will work effectively as a pinning center.

Another possible reason to explain why a superconductor according to the present invention has an extremely high superconductive critical current density even in the magnetic field will now be discussed. In the process of cooling from the state where the liquid phase coexists, defects such as dislocations and stacking faults are introduced inside the crystal grain of the superconductive material, resulting in creation of pinning centers. This may give an extremely high superconductive critical current density even in a magnetic field. Thus, it is not currently possible to determine the most effective pinning center. If the superconductor containing one type or more selected from among Tl, Pb and Bi, one type or more of Ba and Sr, and Ca, Cu and O is produced by heating it at least once to the temperature range where the liquid phase occurs, it is possible to obtain a superconductor having an extremely high superconductive critical current density even in the magnetic field.

Figure 4:
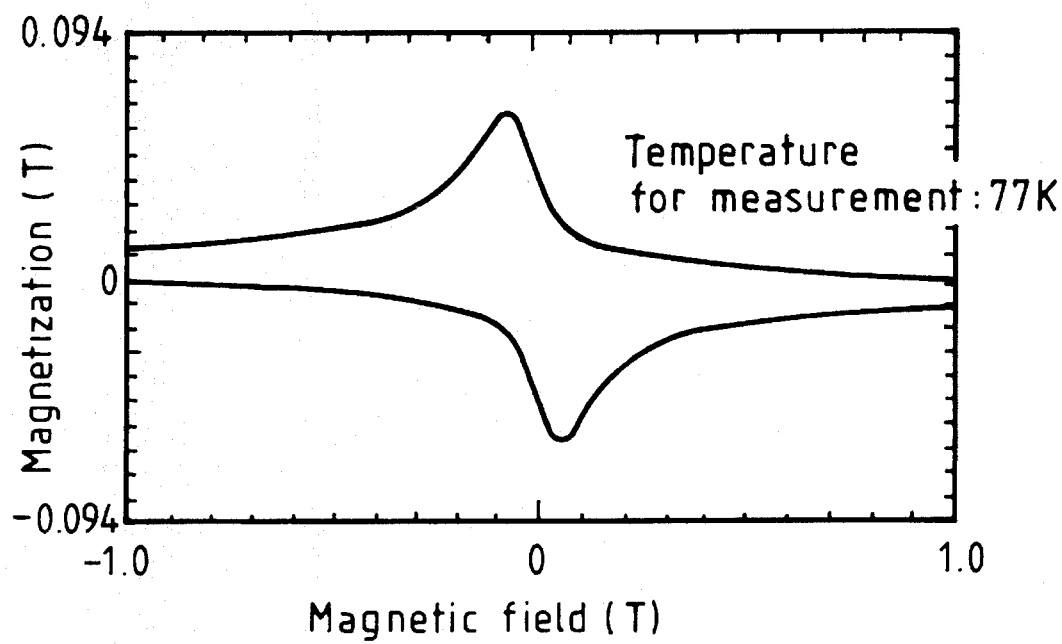
FIG. 4 is a magnetism/hysteresis curve for the material of Embodiment 2.

FIG. 4 illustrates a superconductor manufactured according to the general principles of the present invention. Its composition can be expressed by Formula 18. Formula 3

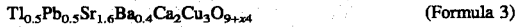

$$Tl_{0.5}Pb_{0.5}Sr_{1.6}Ba_{0.4}Ca_2Cu_3O_{9+x4} \quad \text{(Formula 3)}$$

It represents the magnetism-hysteresis curve of the superconductor manufactured in a process in which the material is sintered for five hours at the temperature of 880° C., then maintained at 980° C. for thirty minutes with liquid phase remaining generated, then cooled down to 880° C. at a cooling speed of 30 degrees, and is sintered for ten hours at 880° C.

Figure 5:
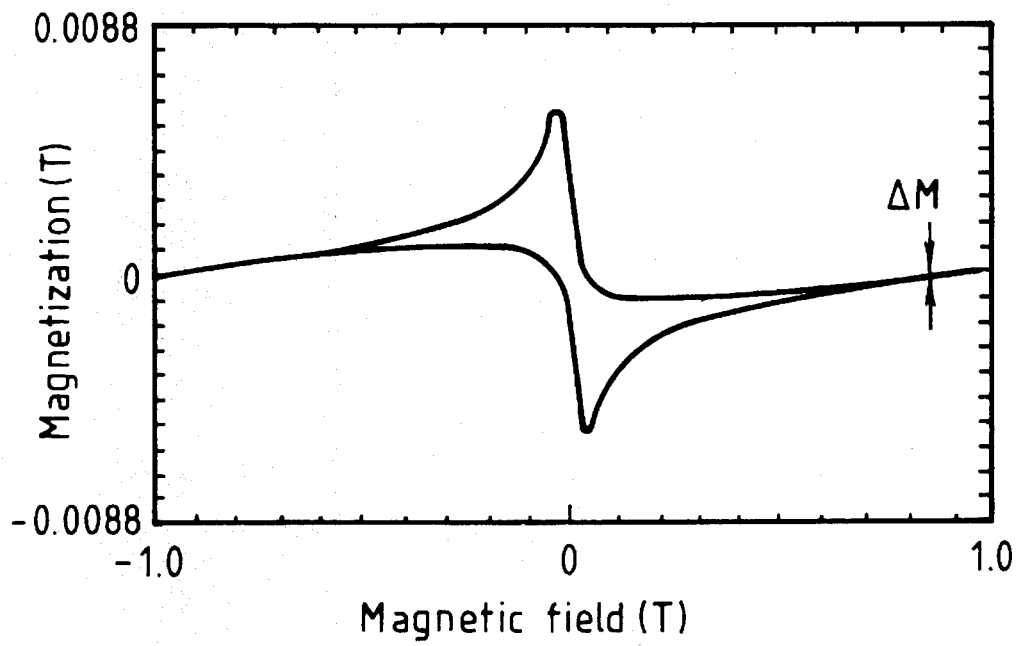
FIG. 5 is a magnetism/hysteresis curve of a known material.

For ease of comparison, FIG. 5 represents the magnetism-hysteresis curve of a superconductor which has the same composition as that of a superconductive material used in the present invention and which has been manufactured by a process in which the liquid phase has never been made to coexist. These measurements have been made using VSM equipment manufactured by Oxford Inc. of the UK In FIG. 5 the size of the hysteresis Δ-M of the curve is proportional to the superconductive critical current density.

These results reveal that, in order to manufacture a superconductor having a good superconductive critical current density even in a magnetic field, it is normally necessary to provide heat-treatment at least once with the liquid phase coexisting, while using the composition of the superconductor selected selected according to the present invention. The structure of the specimen was investigated using a scanner type electron microscope. The observation showed that the material consisted of the crystals of oxides comprising about 30 percent of $Tl_{0.5}Pb_{0.5}Sr_{1.6}Ba_{0.4}CaCu_3O_7$, about 40 percent of $Tl_{0.5}Pb_{0.5}Sr_{1.6}Ba_{0.4}Ca_2Cu_3O_9$, about 10 percent of the $BaPbO_3$, and about 10 percent of Ca, Sr, Cu and O in terms of volume rate. The size of the crystal grain of the superconductor crystal phase was about 30 microns, and the average distance of the triple point on the boundary was about 30 microns.

This points to the strong possibility that the triple point on the boundary is working as a pinning center for the non-superconductive material comprising the elements composing the superconductor. However, this is only an assumption at the current stage. There remains a possibility that the material having the composition used in the present invention is heat-treated at least once at the temperature range where liquid phase coexists, and the pinning center would be introduced in different forms (e.g. in the form of vacancy, dislocation and stacking faults), which would contribute to the drastic improvement of the superconductive critical current density. However, at the current stage, it is not yet clear what feature is acting as a pinning center. If the superconductor containing one type or more selected from among the Tl, Pb and Bi, one type or more of the Ba and Sr, and Ca, Cu and O is produced by heating at least once up to the temperature range where the liquid phase occurs, it is possible to obtain a superconductor having an extremely high superconductive critical current density even in the magnetic field.

Figure 2:
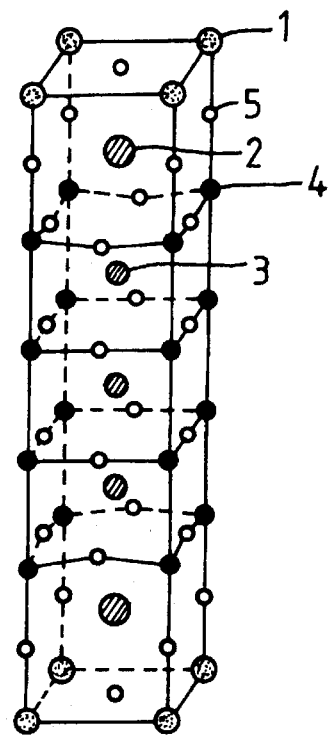
FIG. 2 shows a model representing the crystal structure of a non-superconductive material used in Embodiment 2 of the present invention.
Figure 3:
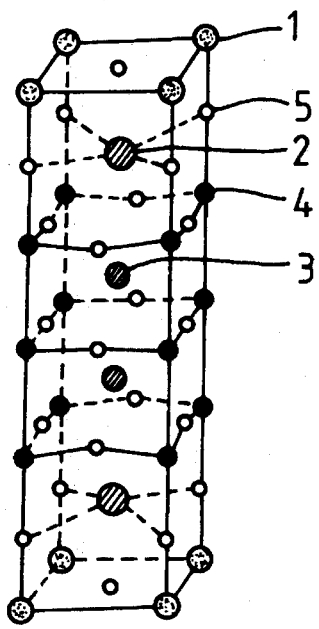
FIG. 3 shows a model representing the crystal structure of a non-superconductive material used in Embodiment 3 of the present invention.

The composition of the superconductive material, non-superconductive material and other materials of the present invention is not restricted to the values given above. Actually, the composition of these oxides includes some degree of indefinite features, and the percentage of the components deviates in the range from ten and several percent to fifty percent. Therefore, even though the composition of the materials of the present invention differs to some extent, such materials are considered to be the same, if the crystal structure of said materials is basically the same as that of the materials of the present invention. FIGS. 1, 2 and 3 show models of the crystal structure of the superconductive materials (Tl, Pb, Bi)(Sr, Ba)$_2$CaCu$_2$O$_7$, (Tl, Pb, Bi)(Ba, Sr)$_2$CaCu$_2$O$_9$, (Tl, Pb, Bi)(Ba, Sr)$_2$Ca$_3$Cu$_4$O$_{11}$) according to the present invention. In FIGS. 1, 2 and 3, the reference numeral 1 indicates atoms of Tl, Pb or Bi; reference numeral 2 indicates atoms of Sr or Ba; reference numeral 3 indicates atoms of Ca; reference numeral 4 indicates atoms of Cu and reference numeral 5 indicates atoms of O.

The present invention is not limited to the examples discussed above. The present invention includes all the superconductors which comprise one type or more selected from among the Tl, Pb and Bi, one type or more of the Ba and Sr, and Ca, Cu and O manufactured by heating at least once up to the temperature range where the liquid phase occurs, and which has an extremely high superconductive critical current density even in the magnetic field.

The second group of embodiments of the present invention relate to a superconductor and a method of production thereof which allows a superconductive current to flow, using cooling with liquid helium or liquid nitrogen, involving an oxide superconductive material.

In the second group of embodiments of the present invention, a non-superconductive material having a crystalline structure preferably isostructural (hereinafter referred to as "similar") to that of the superconductive material, the non-superconductive material being obtained by substituting other elements for one or more elements of the superconductive material,into in the matrix of the oxide superconductive materials.

The material most suited for combination with the superconductive materials (featuring the greatest pinning force), size of the pinning center,and dispersion status for a variety of oxide superconductive materials has been further considered in the second group of embodiments. When a non-superconductive material, for which the lattice constant is close to that of the oxide superconductive material used as superconductive material and has the same crystalline structure (is isostructural) is used as a material to for the pinning center, it has been found possible to manufacture a superconductor featuring a very strong pinning force, that is, with a high superconductive critical current density "Jc" even in a magnetic field.

Furthermore, if the superconductor is manufactured so as to include a metal which does not react significantly with these materials at the temperature at which the superconductors are manufactured, in addition to the superconductive material and the non-superconductive material, this will facilitate the process of manufacturing the superconductor with a high value of "Jc" in a magnetic field. The metal part should preferably be dispersed uniformly; the volume rate should be 50 percent or less, preferably 20 percent.

When current is applied to a superconductor using oxide superconductive material of a polycrystalline nature, the superconductive critical current density (Jc) of the superconductor juncture at the grain boundary is generally lower than that of the superconductive state within the crystalline grain; thus, presence of a non-superconductive material within the crystalline grain is more effective than presence on the grain boundary of the superconductive material in order to ensure high Jc of the superconductor.

Consideration has been given to a technique which increases the Jc value in the magnetic field of the superconductor using the oxide superconductive material. Studies have been made of Y—BA—Cu—O, Bi—Sr—Ca—Cu—O, Tl—Ba—Ca—Cu—O, Tl—Sr—Ca—Cu—O, Pb—Sr—Ca—Cu—O and almost all the oxide superconductive materials considered to be derived therefrom. As a result, in order to obtain a superconductor which can be expected to provide higher Jc value, the following six combinations are extremely effective:

(1) a combination of the oxide superconductive material $(Tl_{1-x1-x2}Pb_{x1}Bi_{x2})Sr_2CaCu_2O_{7+x3}$ (where $0 \leq X1 < 0.8$, $0 \leq X2 < 0.5$, $0 < X1+X2 < 1$, $-0.5 < X3 < 0.5$) and pinning centers formed by non-superconductive material having the crystalline structure similar to that of said superconductive material, obtained by substituting other elements for one or more elements constituting the superconductive material $(Tl_{1-x1-x2}Pb_{x1}Bi_{x2})Sr_2LnCu_2O_{7+x4}$ (where Ln is yttrium or one or more of the elements selected from the rare earth elements, $-0.5 < X4 < 0.5$) or $(Tl_{1-x1-x2}Pb_{x1}Bi_{x2})Ln_2CaCu_2O_{7+x4}$, (where Ln is yttrium or one or more of the elements selected from the rare earth elements, $-0.5 < X4 < 0.5$), (2) a combination of the oxide superconductive material $(Tl_{1-x1-x2}Pb_{x1}Bi_{x2})Sr_2Ca_2Cu_3O_{9+x3}$ (where $0 \leq X1 < 0.8$, $0 \leq X2 < 0.5$, $0 < X1+X2 < 1$, $-0.5 < X3 < 0.5$) and pinning centers formed by a non-superconductive material having a crystalline structure similar to that of the superconductive material, obtained by substituting other elements for one or more elements constituting the superconductive material $(Tl_{1-x1-x2}Pb_{x1}Bi_{x2})Sr_2LnCaCu_3O_{9+x4}$ (where Ln is yttrium or one or more of the elements selected from the rare earth elements, $-0.5 < X4 < 0.5$) or $(Tl_{1-x1-x2}Pb_{x1}Bi_{x2})LnSrCa_2Cu_3O_{9+x4}$, (where Ln is yttrium or one or more of the elements selected from the rare earth elements, $-0.5 < X4 < 0.5$), (3) a combination of the oxide superconductive material $(Tl_{1-x1-x2}Pb_{x1}Bi_{x2})Sr_2Ca_3Cu_4O_{11+x3}$ (where $0 \leq X1 < 0.8$, $0 \leq X2 < 0.5$, $0 < X1+X2 < 1$, $-0.5 < X3 < 0.5$) and pinning centers formed by non-superconductive material having a crystalline structure similar to that of the superconductive material, obtained by substituting other elements for one or more elements constituting the superconductive material $(Tl_{1-x1-x2}Pb_{x1}Bi_{x2})Sr_2LnCa_2Cu_4O_{11+x4}$ (where Ln is yttrium or one or more of the elements selected from the rare earth elements, $-0.5 < X4 < 0.5$) or $(Tl_{1-x1-x2}Pb_{x1}Bi_{x2})LnSrCa_3Cu_4O_{11+x4}$, (where Ln is yttrium or one or more of the elements selected from the rare earth elements, $-0.5 < X4 < 0.5$), (4) a combination of the oxide superconductive material and a non-superconductive material corresponding to case (1) above, but with some of the atoms of Sr of the non-superconductive material replaced by Ba, (5) a combination of the oxide superconductive material and a non-superconductive material corresponding to case (2) above, but with some of the atoms of Sr of the non-superconductive material replaced by Ba, and (6) a combination of the oxide superconductive material and a non-superconductive material corresponding to case (3) above, but with some of the atoms of Sr of the non-superconductive material replaced by Ba. A superconductor without element Bi present is preferred in this case in order to facilitate the manufacture process.

When considering the percentage of Tl and Pb contained therein, matching between the superconductive material and non-superconductive material appears to be the most effective when the X1 value is 0.3 to 0.8; a higher Jc value is then obtained. The superconductive critical current density of the superconductors manufactured for the six cases above were measured at a temperature of 77 K. in a magnetic field of 1 tesla. The Jc values obtained were 5000 A/cm$^2$ in all cases.

Next, the following combination was considered;

(7) A combination of the oxide superconductive material $(Cu_{1-x1}Pb_{x1})Sr_2CaCu_2O_{7+x2}$ (where $0 \leq X1 \leq 0.9$, $-0.5 < X2 < 0.5$) and pinning centers formed by non-superconductive material having a crystalline structure similar to that of the superconductive material, obtained by substituting other elements for one or more elements constituting the superconductive material $(Cu_{1-x1}Pb_{x1})Sr_2LnCu_2O_{7+x2}$ (where $0 \leq X1 < 0.9$, $-0.5 < X2 < 0.5$, Ln is yttrium or one or more of the elements selected from the rare earth elements) or $(Cu_{1-x1}Pb_{x1})SrLnCaCu_2O_{7+x2}$ (where $0 \leq X1 < 0.9$, $-0.5 > X2 \leq 0.5$, Ln is yttrium or one or more of the elements selected from the rare earth elements), and it has been found that these combinations produced higher Jc values. A manufactured superconductor was placed in a magnetic field of 1 tesla at a temperature of 77 K. to measure the the superconductive critical current density, and the result of that measurment was approximately 3000 to 4000 A/cm$^2$.

When another superconductive material is used as the oxide superconductive material, for example:

(8) a combination of the oxide superconductive material $Tl_2Ba_2Ca_2Cu_3O_{10+x}$ (where $-0.5 < X < 0.5$), and pinning centers formed by a non-superconductive material having a crystalline structure similar to that of the superconductive material, obtained by substituting other elements for one or more elements constituting the superconductive material $Tl_2Ba_2CaLnCu_3O_{10+x}$ (where $-0.5 < X < 0.5$, Ln is yttrium or one or more of the elements selected from the rare earth elements, $0.5 < X < 0.5$), (9) a combination of the oxide superconductive material $Bi_2SrCa_2Cu_3O_{10+x}$ (where $-0.5<X<0.5$), and pinning centers formed by a non-superconductive material having a crystalline structure similar to that of the superconductive material, obtained by substituting other elements for one or more elements constituting the superconductive material $Bi_2Sr_2CaLnCu_3O_{10+x}$ (where $0.5<X<0.5$, Ln is yttrium or one or more of the elements selected from the rare earth elements),

(10) a combination of the oxide superconductive material $Tl_2Ba_2CaCu_2O_{8+x}$ (where $-0.5<X<0.5$), and pinning centers formed of a non-superconductive material having a crystalline structure similar to that of the superconductive material, obtained by substituting other elements for one or more elements constituting the superconductive material $Tl_2Ba_2LnCu_2O_{8+x}$ (where $0.5<X<0.5$, Ln is yttrium or one or more of the elements selected from the rare earth elements), or

(11) a combination of the oxide superconductive material $Bi_2Sr_2CaCu_2O_{8+x}$ (where $-0.5<X<0.5$), and pinning centers formed by a non-superconductive material having a crystalline structure similar to that of the superconductive material, obtained by substituting other elements for one or more elements constituting the superconductive material $Bi_2Sr_2LnCu_2O_{8+x}$ (where $-0.5<X<0.5$, Ln is yttrium or one or more of the elements selected from the rare earth elements).

In these cases, higher Jc values have been obtained. A manufactured superconductor was placed in a magnetic field of 1 tesla at a temperature of 77 K. to measure the the superconductive critical current density, and the results of those measurements were approximately 1000 to 2000 $A/cm^2$.

The superconductive critical current temperature was the highest for case (8); however, a higher Jc value in a magnetic field was exhibited in cases (1) to (7), for which the critical temperature is lower. This is believed to be due to the difference of the crystalline structures between superconductive materials of cases (1) to (7) and those of cases (8) to (11). The superconductive materials of cases (8) to (11) have a crystalline structures in which two planes of Tl—O or Bi—O overlap, those of cases (1) to (7) have crystalline structures which include only one of the planes Tl—O, (Tl,Bi)—O, (Tl,Pb)—O and (Tl,Pb,Bi)—O. Because of such difference of crystalline structures, matching difference occurs between the superconductive material and non-superconductive material constituting the superconductor, which causes a difference in the pinning force, which, in turn, causes a difference in the Jc values in the magnetic field. Thus, it is possible to consider that the superconductors having a Jc value in the magnetic field can be obtained by using superconductive materials having the same crystalline structures as those of superconductors from cases (1) to (7) and by use of the same structure for the superconductor as that of the prevent invention.

As has previously been mentioned, when manufacturing the superconductors, it is desirable to include the step of allowing the superconductors to reach a temperature range in which the liquid phase will be generated at least once, in order to disperse the pinning centers uniformly. To remove harmful materials from the crystal grain boundaries of the superconductive material and non-superconductive material, it is desirable to include a process which, at least once, provides heat treatment within the range from a temperature equal to or greater than a temperature 50 degrees lower than the temperature at which the liquid phase begins to be generated, to a temperature equal to or smaller than the temperature at which all components turn into the liquid phase.

The Jc value in a magnetic field may be further improved by separating the non-superconductive material acting as pinning centers inside the superconductor. The material to be used for this purpose is required to be a non-superconductive material which, in the manufacture process, does not react with the oxide superconductive material constituting the superconductor and the non-superconductive material having a crystalline structure similar to that of the superconductive material and obtained by substituting the other elements for one or more elements of the superconductive material. Any material meeting this requirement can function as a pinning center. However, the pinning force differs according to the phase between the oxide superconductive material used and the non-superconductive material. Many non-superconductive material (non-superconductive materials (G)) have been introduced into the metric of the oxide superconductive material, and the non-superconductive material (A) having a crystalline structure similar to that of the superconductive material obtained by substituting other elements for one or more elements of the introduced superconductive material into the superconductive material, in an effort to find out what kind of non-superconductive material is most suited as a material to form pinning centers. As a result, it has been found that the oxide superconductive material, or the material consisting only of the elements which constitutes the non-superconductive material is the most effective as a non-superconductive material (non-superconductive materials (G)). In particular, CaO, SrO, $Ca_2CuO_3$, $Ca_2PbO_4$, $BaPbO_3$ and $BiBaO_3$ have been found effective.

The best way of introducing these non-superconductive materials (non-superconductive materials (G)) into the superconductor is a manufacturing process (see FIG. 1) in which oxide superconductive material particles or particles of the superconductor (superconductor (B)) of the oxide superconductive material and non-superconductive material (having a crystalline structure similar to that of the superconductive material obtained by substituting other elements for one or more elements constituting the superconductive material), and particles of the non-superconductive material (G) are allowed to coexist; then the crystal grains of the oxide superconductive material or the superconductor (B) are caused to grow to large sizes, thereby allowing the non-superconductive material (G) to exist inside the crystal grains of the oxide conductive material.

It is also possible, for example, to heat the superconductor containing $Tl_{0.5}Pb_{0.5}Sr_2Ca_2Cu_3O_9$ to a temperature of about 900° C., causing the following decomposition:

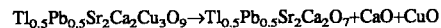

Due to this decomposition process, the non-superconductive material is made to separate into crystal grains of the superconductor and to form pinning centers, thereby improving the Jc value in a magnetic field.

It has been mentioned above that the present invention permits a high Jc value to be obtained in a magnetic field. It has been found that a superconductor according to the present invention exhibits a significantly smaller reduction in Jc with increasing magnetic field, as compared to known superconductors. The value of Jc at 77 K. in a field of 1T scarcely differs from that at 77 K. in a field of 5T. The rate of decrease has been found to be 10% or less.

When manufacturing a superconductor according to the present invention, it is possible to obtain a superconductor featuring excellent properties with improved bondage between the crystal grains, by heat-treating the said oxide superconductive material and non-superconductive material (A) after making them amorphous and by crystallizing them, thereby manufacturing the superconductor. To make them amorphous, an abrupt cooling method (to cool the these materials abruptly from the liquid phase), spattering method, laser deposition method, deposition method, thermal spraying method, chemical vapor phase deposition, etc. may be used with successful results, as has previously been mentioned.

One of the products in which a superconductor according to the present invention may be used is a superconductive wire. The most general configuration is such that the superconductor is present inside a para-conductive coating. In this case, the crystal axes of the superconductor should be in the same directions whenever possible. This is because the oxide superconductive material used in the present invention has an anisotropic property such that superconductive current flows more easily in the inner direction of the surface a-b, but does not flow so easily in other directions. Thus, the crystals should be oriented in a uniform direction in order to allow more superconductive current to flow. When manufacturing these superconductive wires, the superconductive particles should be sufficiently bonded together. This requires the heating temperature of 600° C. or more. However, the superconductive material will decompose at the high temperature of 1300° C. or more, so lower temperatures must be employed.

In a superconductor of the present invention, a non-superconductive material having a crystalline structure similar to that of the superconductive material, obtained by substituting other elements for one or more elements constituting the superconductive material may thus be present, to act as pinning centers in the matrix of the superconductive materials. This ensures a deflection-free boundary between the superconductor and the pinning centers, with excellent matching properties, thereby providing the superconductor with great pinning force.

In the manufacturing method of a superconductor according to the present invention, heat treatment may be performed with the liquid phase coexisting. Coexistence of the liquid phase increases the speed of atomic dispersion, resulting in improved crystal properties of the materials constituting the superconductor and in better bondage between the crystal grains.

DETAILED DESCRIPTION OF EMBODIMENTS

The first group of embodiments of the present invention relate to (i) the composition of a superconductor which allows a superconductive current to flow, using liquid helium or liquid nitrogen cooling, by the use of oxide superconductive material liquid nitrogen, (ii) a superconductive wire, superconductive coil and magnetic shielded material using such a composition, and (iii) a method of manufacturing of such a composition, wire etc.

In this first group of embodiments of the present invention, the advantages sought depend on the composition of the superconductor, and the production method normally involves (1) causing a superconductor comprising the superconductive material consisting of at least Tl, Sr, Ca, Cu and O as constituent elements to reach a temperature range where liquid phase is once created, thereby improving the bondage among the crystal grains comprising the superconductive material, and (2) optionally, dispersing non-superconductive material or less superconductive material inside and outside the crystal grains of the superconductive material.

Embodiments belonging to the first group of embodiments of the present invention will now be described:

Embodiment 1

As the starting materials, $Tl_2O_3$, PbO, BaO, SrO, CaO, CuO with a purity of 99 percent or more were used. Firstly, the BaO, SrO, CaO and CuO were mixed so that the atomic ratio of the Ba:Sr:Ca:Cu would be 1.6:0.4:1:2 and was sintered in the atmosphere for twenty hours at the temperature of 900° C. This powder was crushed in an agate mortar, and the resulting powder was mixed with the $Tl_2O_3$ and PbO, so that the atomic ratio of the Tl:Pb:Ba:Sr:Ca:Cu was 0.5:0.5:1.6:0.4:1:2. When the powder was mixed sufficiently in the agate mortar, it was pressurized and molded into the form of a disk 20 mm in diameter and 2 mm in thickness, and was placed in an alumina crucible with a cover. Then, it was heat-treated in the atmosphere for five hours at a temperature of 900° C. The resulting sintered material was subjected to X-ray diffractometry for powder and the result was analyzed by the Riedweld method, to confirm that the superconductive material having the crystal structure shown in FIG. 1 was present with a percentage of at least 90%.

This sintered material was heated in the atmosphere to 970° C. at a heating speed of 30 degrees per minute and was maintained under that condition for one hour. Then it was cooled down to 880° C. at a cooling speed of 30 degrees per minute, and was maintained under that condition for fifty hours. The superconductive critical temperature was measured by the d.c. four-terminal method, and it was confirmed that the electric resistance reached zero at 92 K. A VSM was used to measure the B-H curve of this specimen at 77 K., and the superconductive critical current density Jc flowing inside the crystal grains was determined, based on the size of the hysteresis. The result was that the Jc value was 25000 A/cm$^2$ when the applied magnetic field was 1 tesla.

Next, this specimen was crushed and a golden pipe with an outer diameter of 6 mm and an inner diameter of 4 mm was filled with the powder. It was then rolled to a thickness of 0.1 mm after being drawn up to an outer diameter of 0.5 mm. This was cut off into a specimen of 30 mm, which was heated to a temperature of 970° C. in an oxygen atmosphere at a heating speed of 30 degrees per minute, at which temperature it was maintained for one hour. Then it was cooled down to 880° C. at a cooling speed of 30 degrees per minute, at which temperature it was maintained for ten hours. After that, the superconductive critical temperature of this specimen was measured by the d.c. four-terminal method at 77 K. in a magnetic field of one tesla, and the Jc value was found to be 19000 A/cm$^2$.

Embodiment 2

As the starting materials, $Tl_2O_3$, PbO, BaO, SrO, CaO, CuO with a purity of 99 percent or more were used. Firstly, the BaO, SrO, CaO and CuO were mixed so that the atomic ratio of the Ba:Sr:Ca:Cu was 1.6:0.4:2:3 and the mixture was sintered in the atmosphere for twenty hours at a temperature of 870° C. This powder was crushed in an agate mortar, and the resulting powder was mixed with the $Tl_2O_3$ and PbO so that the atomic ratio of the Tl:Pb:Ba:Sr:Ca:Cu was 0.5:0.5:1.6:0.4:2:3. When the powder was mixed sufficiently in the agate mortar, it was pressurized and molded into the form of a disk form of 20 mm in diameter and 2 mm in thickness, and was placed in an alumina crucible with a cover, to be heat-treated in the atmosphere for five hours at the temperature of 880° C. The resulting sintered material was subjected to X-ray diffractometry for powder and the result was analyzed by the Rietveld method, to confirm that the superconductive material having the crystal structure shown in FIG. 2 was present with a percentage of at least 90%.

This sintered material was heated in the atmosphere to 970° C. at a heating speed of 30 degrees per minute and was maintained under that condition for one hour. Then it was cooled down to 880° C. at a cooling speed of 30 degrees per minute, and was maintained under that condition for fifty hours. The superconductive critical temperature was measured by the d.c. four-terminal method, and it was confirmed that the electric resistance reached zero at 92 K. A VSM was used to measure the B-H curve of this specimen at 77 K., and the superconductive critical current density Jc flowing inside the crystal grains was measured, based on the size of the hysteresis. The result was that the Jc value was 55000 A/cm$^2$ when the applied magnetic field was 1 tesla.

Next, this specimen was crushed and a golden pipe with an outer diameter of 6 mm and an inner diameter of 4 mm was filled with the powder. It was then rolled to a thickness of 0.1 mm after being drawn up to the outer diameter of 0.5 mm. This was cut off into a specimen of 30 mm, which was heated to the temperature of 970° C. in an oxygen atmosphere at a heating speed of 30 degrees per minute, at which temperature it was maintained for one hour. Then it was cooled down to 880° C. at a cooling speed of 30 degrees per minute, at which temperature it was maintained for ten hours. After that, the superconductive critical temperature of this specimen was measured by the d.c. four-terminal method at 77 K. in a magnetic field of one tesla, and the Jc value was found to be 28000 A/cm$^2$.

A specimen of this superconductive wire was ground at sections, and a scanner type electronic microscope was used to observed the structure within the specimen. The gray portion of said structure was analyzed by EDX, showing that this portion was composed of Tl:Pb:Ba:Sr:Ca:Cu= 0.46:0.53:1.6:0.4:1.5:2.6. This portion is known to be composed of the coexisting $Tl_{0.5}Pb_{0.5}Ba_{1.6}Sr_{0.4}CaCu_2O_7$ and $Tl_{0.5}Pb_{0.5}Ba_{1.6}Sr_{0.4}Ca_2Cu_3O_9$. The white portion contains only Ba and Pb, and is considered to be $BaPbO_3$. The black portion was analyzed by the EDX, showing that this portion was composed of Tl:Pb:Ba:Sr:Ca:Cu= 0.04:0.03:0.1:0.6:1.8:1.0. From this, it can been seen that the crystal grains of the superconductive material having the crystal structure shown in FIG. 1 and FIG. 2 and the different non-superconductive material composed of the elements constituting the superconductor are separated in the superconductor according to the present Embodiment.

The specimen was then pressurized and molded to a thickness of 0.06 mm. It was heated to the temperature of 970° C. in an oxygen atmosphere at a heating speed of 30 degrees per minute, at which temperature it was maintained for one hour. Then it was cooled down to 880° C. at a cooling speed of 30 degrees per minute, at which temperature it was maintained for ten hours. The superconductive portion of the specimen thus obtained was subjected to X-ray diffractometry for powder, to check the orientation of the crystal grains. The result revealed that the crystal faces a-b of over fifty percent of the total crystal particles were arranged so as to be parallel to the tape face of the tape-formed wire material. A scanner type electronic microscope was used to check the tape sections, and this showed that only five of the crystal grains, or less, were arranged in the direction of thickness.

Embodiment 3

As the starting materials, $Tl_2O_3$, PbO, BaO, SrO, CaO, CuO with a purity of 99 percent or more were used. Firstly, the BaO, SrO, CaO and CuO were mixed so that the atomic ratio of the Ba:Sr:Ca:Cu was 1.6:0.4:3:4 and the mixture was sintered in the atmosphere for twenty hours at the temperature of 870° C. This powder was crushed in an agate mortar, and resulting powder was mixed with the $Tl_2O_3$ and PbO so that the atomic ratio of the Tl:Pb:Ba:Sr:Ca:Cu was 0.5:0.5:1.6:0.4:3:4. When the powder was mixed sufficiently in the agate mortar, it was pressurized and molded into the form of a disk 20 mm in diameter and 2 mm in thickness, and was placed in an alumina crucible with a cover, to be heat-treated in the atmosphere for five hours at a temperature of 880° C. The resulting sintered material was subjected to X-ray diffractometry for powder and the result was analyzed by the Rietveld method, to confirm that the superconductive material having the crystal structure shown in FIG. 3 was present with a percentage of at least 90%.

This sintered material was heated in the atmosphere to 970° C. at a heating speed of 30 degrees per minute and was maintained under that condition for one hour. Then it was cooled down to 880° C. at a cooling speed of 30 degrees per minute, and was maintained under that condition for fifty hours. The superconductive critical temperature was measured by the d.c. four-terminal method, and it was confirmed that the electric resistance reached zero at 92 K. A VSM was used to measure the B-H curve of this specimen at 110 K., and the superconductive critical current density Jc flowing inside the crystal grains was determined, based on the size of the hysteresis. The result was that the Jc value was found to be 45000 A/cm$^2$ when the applied magnetic field was 1 tesla.

Next, this specimen was crushed and a golden pipe with an outer diameter of 6 mm and an inner diameter of 4 mm was filled with the powder. It was then rolled to a thickness of 0.1 mm after being drawn up to the outer diameter of 0.5 mm. This was cut off into a specimen of 30 mm, which was heated to the temperature of 970° C. in an oxygen atmosphere at a heating speed of 30 degrees per minute, at which temperature it was maintained for one hour. Then it was cooled down to 880° C. at a cooling speed of 30 degrees per minute, at which temperature it was maintained for ten hours. After that, the superconductive critical temperature of this specimen was measured by the d.c. four-terminal method at 77 K. in a magnetic field of one tesla, and the Jc value was found to be 21000 A/cm$^2$.

A specimen of this superconductive wire was ground at sections, and a scanner type electronic microscope was used to observed the structure within the specimen. About eighty percent of the entire area was composed of a mixture of $Tl_{0.5}Pb_{0.5}Ba_{1.6}Sr_{0.4}CaCu_2O_7$, $Tl_{0.5}Pb_{0.5}Ba_{1.6}Sr_{0.4}Ca_2Cu_4O_9$ and $Tl_{0.5}Pb_{0.5}Ba_{1.6}Sr_{0.4}Ca_3Cu_4O_{11}$. About ten percent was composed of $BaPbO_3$ and another ten percent was composed of Sr—Ca—Cu—O.

Embodiment 4

As the starting materials, $Tl_2O_3$, PbO, BaO, SrO, CaO, CuO with a purity of 99 percent or more were used. Firstly, the BaO, SrO, CaO and CuO were mixed so that the atomic ratio of the Ba:Sr:Ca:Cu was 1.6:0.4:2:3 and the mixture was sintered in the atmosphere for twenty hours at a temperature of 870° C. This powder was crushed in an agate mortar, and resulting powder was mixed with the $Tl_2O_3$ and PbO so that the atomic ratio of the Tl:Pb:Ba:Sr:Ca:Cu was 0.5:0.5:1.6:0.4:2:3. When the powder was mixed sufficiently in the agate mortar, it was pressurized and molded into the form of a disk with a diameter of 20 mm and a thickness of 2 mm, and was placed in an alumina crucible with a cover, to be heat-treated in the atmosphere for five hours at the temperature of 880° C. The resulting sintered material was subjected to X-ray diffractometry for powder, and it was confirmed that a superconductive material having the crystal structure shown in FIG. 2 was present with a percentage of at least 90%.

This sintered material was heated in the atmosphere to 980° C. at a heating speed of 30 degrees per minute and was maintained under that condition for one hour. Then it was cooled down to 880° C. at a cooling speed of 10 degrees per minute, and was maintained under that condition for fifty hours. The superconductive critical temperature was measured by the d.c. four-terminal method, and it was confirmed that the electric resistance reached zero at 115 K. A VSM was used to measure the B-H curve of this specimen at 77 K., and the superconductive critical current density Jc flowing inside the crystal grains was determined, based on the size of the hysteresis. The result was that the Jc value was found to be 52000 A/cm$^2$ when the applied magnetic field was 1 tesla.

Next, this specimen was crushed and was mixed with one tenth of powdered CaO in terms of volume ratio. The resulting powder was placed in an alumina crucible with a cover, to be heat-treated in the atmosphere for five hours to a temperature of 980° C. at a heating speed of 30 degrees per minute, at which temperature it was maintained for one hour. Then it was cooled down to 880° C. at a cooling speed of 10 degrees per minute, at which temperature it was maintained for fifty hours. After that, the superconductive critical temperature of this specimen was measured by the d.c. four-terminal method and it was confirmed that the electric resistance reached zero at 115 K. A VSM was used to measure the B-H curve of this specimen at 77 K., and the superconductive critical current density Jc flowing inside the crystal grains was determined, based on the size of the hysteresis. The result was that the Jc value was found to be 67000 A/cm$^2$ when the applied magnetic field was 1 tesla. This thus revealed that the CaO particles acted as effective pinning centers.

Next, this specimen was crushed and a golden pipe of 6 mm outer diameter and 4 mm inner diameter was filled with the powder. It was then rolled to a thickness of 0.1 mm after being drawn up to the outer diameter of 0.5 mm. This was cut off into a specimen of 30 mm, which was sintered at the temperature of 1050° C. in the atmosphere for ten minutes. Then it was cooled down to 880° C., at which temperature it was sintered for five hours. After that, the superconductive critical temperature of this specimen was measured by the d.c. four-terminal method at 77 K. in a magnetic field of one tesla, and the Jc value was found to be 45000 A/cm$^2$.

Embodiment 5

SrO was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 35000 A/cm$^2$.

Embodiment 6

$Ca_2CuO_3$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 46000 A/cm$^2$.

Embodiment 7

$Ca_2PbO_4$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 39000 A/cm$^2$.

Embodiment 8

$BaPbO_3$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 49000 A/cm$^2$.

Embodiment 9

$BaBiO_3$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 31000 A/cm$^2$.

Embodiment 10

$ZrO_2$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 35000 A/cm$^2$.

Embodiment 11

$Y_2O_3$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 35000 A/cm$^2$.

Embodiment 12

The $Tl_{0.5}Pb_{0.5}Sr_2SmCu_2O_7$ was used instead of CaO in Embodiment 4, and a wire specimen was manufactured using the same procedure as for Embodiment 4. The superconductive critical temperature of this specimen was measured by the d.c. four-terminal method at 77 K. in a magnetic field of one tesla, and the Jc value was found to be 55000 A/cm$^2$.

Embodiment 13

As the starting materials, $Tl_2O_3$, PbO, BaO, CaO and CuO with a purity of 99 percent or more were used, and a variety of oxide superconductive materials were produced with different percentages of Tl and Pb. The BaO, SrO, CaO and CuO were mixed so that the atomic ratio of the Ba:Sr:Ca:Cu was 1.7:0.3:2:3 and the mixture was sintered in the atmosphere for twenty hours at a temperature of 880° C. This powder was crushed in an agate mortar, and resulting powder was mixed with the $Tl_2O_3$ and PbO so that the atomic ratio of the Tl:Pb:Ba:Sr:Ca:Cu was (1-X):X:1.6:0.4:2:3, (where the value of X was varied to produce superconductive materials with different percentages of Tl and Pb contained therein). After this was mixed sufficiently in the agate mortar, the powder was pressurized and molded into the form of a disk 20 mm in diameter and 2 mm in thickness, and was placed in an alumina crucible with a cover, to be sintered in the atmosphere for five hours at a temperature of 880° C. This sintered material was heated in the atmosphere to 970° C. at a heating speed of 30 degrees per minute and was maintained under that condition for one hour. Then it was cooled down to 880° C. at a cooling speed of 10 degrees per minute, and was maintained under that condition for fifty hours.

The superconductive critical temperature was measured by the d.c. four-terminal method, and the temperature "Tc" at which the electric resistance reached zero was determined. A VSM was used to measure the B-H curve of this specimen at 77 K., and the superconductive critical current density "Jc" flowing inside the crystal grains was determined, based on the size of the hysteresis. The superconductive critical current densities "Jc" were determined when one tesla of magnetic field was applied, and the results are shown in Table 1. This Table reveals that the performance of the superconductors varies according to the percentage of Tl and Pb contained therein, and the value of X must be maintained within a suitable range.

TABLE 1

| Value of X | Tc  | Jc    |
|------------|-----|-------|
| 0.1        | 106 | 29000 |
| 0.2        | 106 | 35000 |
| 0.3        | 110 | 46000 |
| 0.4        | 115 | 53000 |
| 0.5        | 114 | 51000 |
| 0.6        | 117 | 49000 |
| 0.7        | 100 | 23000 |
| 0.8        | 95  | 12000 |
| 0.9        | 60  | 5000  |
| 1.0        | —   | 0     |

Embodiment 14

As the starting materials, $Tl_2O_3$, PbO, $Bi_2O_3$, BaO, CaO and CuO with a purity of 99 percent or more were used, and a variety of oxide superconductive materials were produced with different percentages of Tl, Pb and Bi. The BaO, SrO, CaO and CuO were mixed so that the atomic ratio of the Ba:Sr:Ca:Cu was 1.5:0.5:2:3 and the mixture was sintered in the atmosphere for twenty hours at the temperature of 880° C. This powder was crushed in an agate mortar, and the resulting powder was mixed with the $Tl_2O_3$, PbO and $Bi_2O_3$ so that the atomic ratio of the Tl:Pb:Bi:Ba:Sr:Ca:Cu was (0.6-X):0.4:X:1.6:0.4:2:3, (where the value of X was varied to produce superconductive materials of different percentages of Tl and Bi contained therein). After this was mixed sufficiently in an agate mortar, the powder was pressurized and molded into the form of a disk 20 mm in diameter and 2 mm in thickness, and was placed in an alumina crucible with a cover, to be sintered in the atmosphere for five hours at the temperature of 880° C. This sintered material was heated in the atmosphere up to 970° C. at a heating speed of 30 degrees per minute and was maintained under that condition for one hour. Then it was cooled down to 880° C. at a cooling speed of 5 degrees per minute, and was maintained under that condition for twenty hours.

The superconductive critical temperature of the resulting sintered material was measured by the d.c. four-terminal method, and the temperature "Tc" at which the electric resistance reached zero was determined. A VSM was used to measure the B-H curve of this specimen at 77 K., and the superconductive critical current density "Jc" flowing inside the crystal grains was determined, based on the size of the hysteresis. The superconductive critical field densities "Jc" were determined when one tesla of magnetic field was applied, and the results are shown in Table 2. Table 2 reveals that the performance of the superconductor varies according to the percentages of the Tl and Bi contained therein, and the value of X must be maintained within a suitable range.

TABLE 2

| Value of X | Tc  | Jc    |
|------------|-----|-------|
| 0.0        | 115 | 42000 |
| 0.1        | 116 | 46000 |
| 0.2        | 113 | 39000 |
| 0.3        | 100 | 16000 |
| 0.4        | 85  | 10000 |
| 0.5        | 74  | —     |
| 0.6        | 61  | —     |

Embodiment 15

As the starting materials, $Tl_2O_3$, PbO, BaO, CaO and CuO with a purity of 99 percent or more were used, and a variety of oxide superconductive materials wre produced with different percentages of Tl and Pb. The BaO, SrO, CaO and CuO were mixed so that the atomic ratio of the Ba:Sr:Ca:Cu was X:(2-X):2:3, and the mixture was sintered in the atmosphere for twenty hours at a temperature of 890° C. This powder was crushed in an agate mortar, and resulting powder was mixed with the $Tl_2O_3$ and PbO so that the atomic ratio of the Tl:Pb:Ba:Sr:Ca:Cu was 0.4:0.6:X:(2-X):2:3, (where the value of X was varied to produce superconductive materials of different percentages of the Ba and Sr contained therein). After this was mixed sufficiently in the agate mortar, the powder was pressurized and molded into the form of a disk 20 mm in diameter and 2 mm in thickness, and was placed in an alumina crucible with a cover, to be sintered in the atmosphere for five hours at a temperature of 890° C. This sintered material was heated in the atmosphere up to 970° C. at a heating speed of 30 degrees per minute and was maintained under that condition for one hour. Then it was cooled down to 890° C. at a cooling speed of 30 degrees per minute, and was maintained under that condition for fifty hours.

Next, this specimen was crushed and a golden pipe of 6 mm outer diameter and 4 mm inner diameter was filled with the powder. It was then rolled to a thickness of 0.1 mm after being drawn up to an outer diameter of 0.5 mm. This was cut off into a specimen of 30 mm, which was heated up to the temperature of 975° C. in an oxygen atmosphere and was maintained for one hour. Then it was cooled down to 890°

C. at a cooling speed of 30 degrees per minute, at which temperature it was maintained for ten hours. After that, the superconductive critical temperature of the specimen was measured by the d.c. four-terminal method, and the temperature "Tc" at which the electric resistance reached zero was determined. A VSM was used to measure the B-H curve of this specimen at 77 K., and the superconductive critical current density "Jc" flowing inside the crystal grains at 77 K. was determined when one tesla of magnetic field was applied, and the results are shown in Table 3. Table 3 reveals that comparatively excellent properties can be maintained within a wide range of percentages of Ba and Sr. Table 3 also indicates, however, that the performance of the superconductors varies according to the percentage of X, and the value of X must be maintained within a suitable range.

TABLE 3

| Value of X | Tc | Jc |
| --- | --- | --- |
| 0.0 | 116 | 11000 |
| 0.1 | 115 | 29000 |
| 0.2 | 117 | 35000 |
| 0.3 | 114 | 46000 |
| 0.4 | 116 | 53000 |
| 0.5 | 115 | 51000 |
| 0.6 | 115 | 59000 |
| 0.7 | 104 | 52000 |
| 0.8 | 118 | 46000 |
| 0.9 | 117 | 45000 |
| 1.0 | 116 | 43000 |
| 1.1 | 118 | 31000 |
| 1.2 | 117 | 10000 |
| 1.3 | 111 | 12000 |

Embodiment 16

Figure 6:
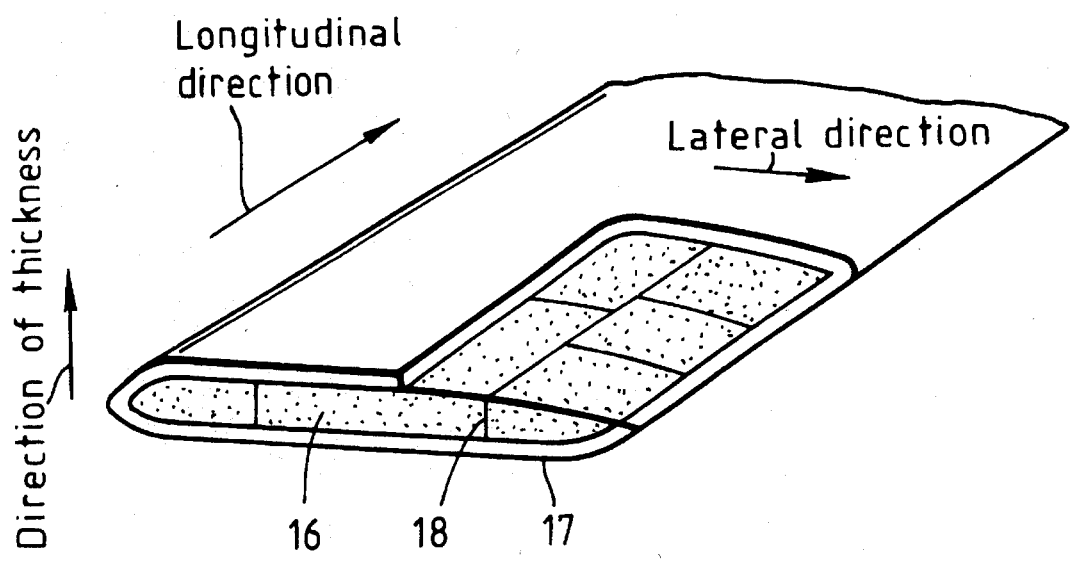
FIG. 6 shows a superconductive wire according to embodiments of the present invention.

FIG. 6 represents the composition of superconductive wire according to some embodiments of the present invention. The product shown in FIG. 6 comprises a superconductor 18 coated with a coating material 17 of an alloy of gold and 5-percentage-by-weight palladium, having a flat shape. The coating material 17 may be made of any metal so long as it does not react significantly with the superconductor; gold, silver, palladium, copper/aluminum alloys and nickel are preferred.

The sintered specimen of the superconductor produced in Embodiment 15 was crushed, put into a pipe of an alloy of gold and 5 weight percent of palladium, the pipe being 100 mm in length, 6 mm in outer diameter and 5 mm in inner diameter. Then the pipe was sealed. It was then drawn to an outer diameter of 1 mm by a draw-bench, and the wire thus produced was further rolled by a cold rolling machine to obtain a wire with a flat sectional structure having a width of 3 mm and thickness of 0.2 mm. The wire was cut to a length of 250 m, and was placed and kept in an atmosphere of 950° C. After part of the wire was molten therein, it was placed into liquid nitrogen to be quenched. After that, the wire was heat-treated at 880° C. for twenty hours. The critical current density of the specimen was measured by the d.c. four-terminal method at 77 K. in a magnetic field of one tesla, with the result being a value of 11000 A/cm$^2$. An electronic microscope was used to observe the orientation of the superconductive crystals, and this revealed that approximately fifty percent of the crystals had their C-axis facing in the thickness direction.

The second group of embodiments of the present Invention relate to a superconductor and a method of production thereof which allows a superconductive current to flow, using cooling with liquid helium or liquid nitrogen, involving an oxide superconductive material.

In the second group of embodiments of the present invention, a non-superconductive material having a crystalline structure isostructural (hereinafter referred to as "similar") to that of the superconductive material, the non-superconductive material being obtained by substituting other elements for one or more elements of the superconductive material,into in the matrix of the oxide superconductive materials.

Embodiment 17

As the starting materials, $Tl_2O_3$, PbO, SrO, CaO, CuO, and $Sm_2O_3$ with a purity of 99 percent or more were used. First, the SrO, CaO, CuO was mixed so that the atomic ratio of the Sr:Ca:Cu was 2:1:2 and was heat-treated in atmosphere for twenty hours at the temperature of 900° C. This powder was crushed in an agate mortar, and the resulting powder was mixed with the $Ti_2O_3$ and PbO so that the atomic ratio of the Tl:Pb:Sr:Ca:Cu was 0.5:0.5:2:1:2. When the powder was mixed sufficiently in the agate mortar, it was pressurized and molded into the form of a disk 20 mm in diameter and 2 mm in thickness, and was placed in an alumina crucible with a cover, to be heat-treated in the atmosphere for five hours at a temperature of 900° C. The resulting sintered material was subjected to X-ray diffractometry for powder, and the result was analyzed by the Riedweld method, to confirm that the superconductive material having the crystal structure as shown in FIG. 1 was present with a percentage of at least 90%.

The superconductive critical temperature of this sintered material was measured by the d.c. four-terminal method, and it was confirmed that the electric resistance reached zero at 95 K. A VSM was used to measure the B-H curve of this sintered specimen at 77 K., and the superconductive critical current density Jc flowing inside the crystal grains of $(Tl_{0.5}Pb_{0.5})Sr_2CaCu_2O_7$ constituting the sintered material, based on the size of the hysteresis. The result was that the Jc value was 900 A/cm$^2$ when the applied magnetic field was 1 tesla.

Next, Sm was substituted for atoms of Ca in the oxide superconductive material $(Tl_{0.5}Pb_{0.5})Sr_2CaCu_2O_7$ to form a non-superconductive material $(Tl_{0.5}Pb_{0.5})Sr_2SmCu_2O_7$. The SrO, $Sm_2O_3$ and CuO were mixed so that the atomic ratio of Sr:Sm:Cu was 2:1:2, and were heat-treated at 900° C. for twenty hours in the atmosphere. This powder was crushed in an agate mortar, and resulting powder was mixed with the $Tl_2O_3$ and PbO so that the atomic ratio of the Tl:Pb:Sr:Sm:Cu was 0.5:0.5:2:1:2. When the powder was mixed sufficiently in the agate mortar, it was pressurized and molded into the form of a disk 20 mm in diameter and 2 mm in thickness, and was placed in an alumina crucible with a cover, to be heat-treated in the atmosphere for five hours at the temperature of 900° C. The resulting sintered material was subjected to X-ray diffractometry for powder, and the result was analyzed by the Riedweld method, to confirm that superconductive material having the crystal structure shown in FIG. 1 was present with a percentage of at least 90%. The electric resistance of this sintered material was measured by the d.c. four-terminal method while changing the temperature. The electric resistance was about 10$^2$ (10 raised to second power) ohms.cm at about 300 K., with the temperature dependency being that of a semiconductor. The measurement was continued up to 4.2 K. without attaining superconductivity within that range.

Next, powder ($Tl_{0.5}Pb_{0.5}$)$Sr_2CaCu_2O_7$ and powder ($Tl_{0.5}Pb_{0.5}$)$Sr_2SmCu_2O_7$ crushed in the agate mortar were mixed so that the molar ratio between ($Tl_{0.5}Pb_{0.5}$)$Sr_2CaCu_2O_7$ and ($Tl_{0.5}Pb_{0.5}$)$Sr_2SmCu_2O_7$ was 9:1. They were sufficiently mixed in the agate mortar. They were then pressurized and molded into the form of a disk 20 mm in diameter and 2 mm in thickness, and were placed in an alumina crucible with a cover, to be heat-treated in the atmosphere for five hours at the temperature of 900° C. The resulting sintered material was analyzed by X-ray diffractometry for powder to confirm that ($Tl_{0.5}Pb_{0.5}$)$Sr_2CaCu_2O_7$ and ($Tl_{0.5}Pb_{0.5}$)$Sr_2SmCu_2O_7$ were present, with very small amounts of other materials. The superconductive critical temperature of this sintered material was measured by the d.c. four-terminal method, and it was confirmed that the electric resistance reached zero at 95 K. A VSM was used to measure the B-H curve of this sintered specimen at 77 K. FIG. 4 shows this result. The superconductive critical current density Jc flowing inside the crystal grains of ($Tl_{0.5}Pb_{0.5}$)$Sr_2CaCu_2O_7$ constituting the sintered material was determined, based on the size of the hysteresis. The result was that the Jc value was 12000 A/cm$^2$ when the applied magnetic field was 1 tesla. This shows that the ($Tl_{0.5}Pb_{0.5}$)$Sr_2SmCu_2O_7$ serves as a very effective pinning center for the oxide superconductive material ($Tl_{0.5}Pb_{0.5}$)$Sr_2CaCu_2O_7$.

Next, this sintered material was again crushed and a golden pipe of 6 mm outer diameter and 4 mm inner diameter was filled with the powder. It was then rolled to a thickness of 0.1 mm after being drawn up to the outer diameter of 0.5 mm. This was cut off into a specimen of 30 mm, which was heat-treated at the temperature of 950° C. in the atmosphere for ten hours. The superconductive critical temperature of this specimen was measured by the d.c. four-terminal method in the magnetic field of 1 tesla at 77 K. and the Jc value was found to be 1000 A/cm$^2$.

A specimen of this superconductive wire was ground at sections, and a scanner type electron microscope was used to observed the structure within the specimen. It was found out that there were two types of areas inside; white areas and black areas. A white area was analyzed by EDX, which showed that this portion was composed of Tl:Pb:Sr:Ca:Sm:Cu= 0.46:0.53:1.9:0.3:0.8:2.0. Considering that the energy of the electron beam of the scanner type electronic microscope extended in the order of several microns, this white portion can be considered to be the non-superconductive material having the crystalline structure shown in FIG. 1 without Ca. On the other hand, the black portion was analyzed by the EDX, which showed that the this portion was composed of Ti:Pb:Sr:Ca:Sm:Cu= 0.43:0.49 1.9:1.0:0.0:2.0. This dark part can be considered to be the superconductive material having the crystalline structure shown in FIG. 1 without Sm. From this, it can been seen that the superconductor having a high Jc value in the magnetic field can be manufactured by combining non-superconductive material having the same crystalline structure as the superconductive material as shown in FIG. 1 with the superconductive material having the same crystalline structure.

Embodiment 18

As the starting materials, $Tl_2O_3$, PbO, SrO, CaO, CuO, and $Sm_{2O3}$ with a purity of 99 percent or more were used. The SrO, CaO, CuO was mixed so that the atomic ratio of the Sr:Ca:Cu was 2:1:2 and the mixture was heat-treated in atmosphere for twenty hours at the temperature of 900° C. This powder was crushed in an agate mortar, and the resulting powder was mixed with the $Tl_2O_3$ and PbO so that the atomic ratio of the Tl:Pb:Sr:Ca:Cu was 0.5:0.5:2:1:2. When the powder was mixed sufficiently in the agate mortar, it was pressurized and molded into a the form of a disk 20 mm in diameter and 2 mm in thickness, and was placed in an alumina crucible with a cover, to be heat-treated in the atmosphere for five hours at a temperature of 900° C. The resulting sintered material was subjected to X-ray diffractometry for powder; it was confirmed that ($Tl_{0.5}Pb_{0.5}$)$Sr_2CaCu_2O_7$ was generated, without any other material being produced. The superconductive critical temperature of this sintered material was measured by the d.c. four-terminal method, and it was found that the electric resistance reached zero at 95 K. A VSM was used to measure the B-H curve of this sintered specimen at 77 K., and the superconductive critical current density Jc flowing inside the crystal grains of ($Tl_{0.5}Pb_{0.5}$)$Sr_2CaCu_2O_7$ of the sintered material was determined, based on the size of the hysteresis. The result was that the Jc value was 900 A/cm$^2$ when the applied magnetic field was 1 tesla.

Next, Sm was substituted for atoms of Ca of the oxide superconductive material ($Tl_{0.5}Pb_{0.5}$)$Sr_2CaCu_2O_7$ to form non-superconductive material ($Tl_{0.5}Pb_{0.5}$)$Sr_2SmCu_2O_7$. The SrO, $Sm_2O_3$ and CuO were mixed so that the atomic ratio of Sr:Sm:Cu was 2:1:2, and were heat-treated at 900° C. for twenty hours in the atmosphere. This powder was crushed in an agate mortar, and the resulting powder was mixed with the $Tl_2O_3$ and PbO so that the atomic ratio of the Tl:Pb:Sr:Sm:Cu was 0.5:0.5:2:1:2. When the powder was mixed sufficiently in the agate mortar, it was pressurized and molded into the form of a disk 20 mm in diameter and 2 mm in thickness, and was placed in an alumina crucible with a cover, to be heat-treated in the atmosphere for five hours at the temperature of 900° C. The resulting sintered material was analyzed by X-ray diffractometry for powder; it was confirmed that ($Tl_{0.5}Pb0.5$ )$Sr_2SmCu_2O_7$ was generated, without any other material being produced. The electric resistance of this sintered material was measured by the d.c. four-terminal method while changing the temperature. The electric resistance was about 10$^2$ (10 raised to second power) ohms.cm at about 300 K., with the temperature dependency being that of a semiconductor. The measurement was continued up to 4.2 K. without attaining superconductivity within that range.

Next, powder ($Tl_{0.5}Pb0.5$ )$Sr_2CaCu_2O_7$ and powder ($Tl_{0.5}Pb_{0.5}$)$Sr_2SmCu_2O_7$ sufficiently crushed in the agate mortar were mixed so that the molar ratio between ($Tl_{0.5}Pb_{0.5}$)$Sr_2CaCu_2O_7$ and ($Tl_{0.5}Pb_{0.5}$)$Sr_2SmCu_2O_7$ was 9:1. They were then pressurized and molded into the form of a disk 20 mm in diameter and 2 mm in thickness, and were placed in an alumina crucible with a cover, to be heat-treated in the atmosphere for one hour at the temperature of 1050° C. Then they were continuously sintered for five hours at a reduced temperature of 900° C. The resulting sintered material was analyzed by X-ray diffractometry for powder to confirm that ($Tl_{0.5}Pb_{0.5}$)$Sr_2CaCu_2O_7$ and ($Tl_{0.5}Pb_{0.5}$)$Sr_2SmCu_2O_7$ were present, without any other material being produced. A scanner type electron microscope was used to observed the structure of this sintered material, and traces were found which showed that the liquid phase was once formed. The superconductive critical temperature of this sintered material was measured by the d.c. four-terminal method, and it was found that the electric resistance reached zero at 95 K. A VSM was used to measure the B-H curve of this sintered specimen at 77 K. The superconductive critical current density Jc flowing inside the crystal grains of $(Tl_{0.5}Pb_{0.5})Sr_2CaCu_2O_7$ constituting the sintered material was determined, based on the size of the hysteresis. The result was that the Jc value was 14000 A/cm$^2$ when the applied magnetic field was 1 tesla. This shows that the $(Tl_{0.5}Pb_{0.5})Sr_2SmCu_2O_7$ serves as a very effective pinning center for the oxide superconductive material $(Tl_{0.5}Pb_{0.5})Sr_2CaCu_2O_7$. It was also found that heat treatment at the temperature at which the liquid phase is generated was effective in generating a superconductor to manufacture a superconductive material with a high Jc value in a magnetic field.

Next, this sintered material was again crushed and a golden pipe of 6 mm outer diameter and 4 mm inner diameter was filled with the powder. It was then rolled to a thickness of 0.1 mm after being drawn up to the outer diameter of 0.5 mm. This was cut off into a specimen of 30 mm, which was heat-treated at the temperature of 950° C. in the atmosphere for ten hours.

The superconductive critical temperature of this specimen was measured by the d.c. four-terminal method in a magnetic field of 1 tesla at 77 K. and the Jc value was found to be 12000 A/cm$^2$.

Embodiment 19

As the starting materials, $Tl_2O_3$, PbO, SrO, CaO, CuO, and $Sm_2O_3$ with a purity of 99 percent or more was used. The SrO, CaO, CuO were mixed so that the atomic ratio of the Sr:Ca:Cu was 2:1:2 and was heat-treated in atmosphere for twenty hours at a temperature of 900° C. This powder was crushed in an agate mortar, and resulting powder was mixed with the $Ti_2O_3$ and PbO so that the atomic ratio of the Tl:Pb:Sr:Ca:Cu was 0.5:0.5:2:1:2. The powder was mixed sufficiently in the agate mortar and was placed in an alumina crucible with a cover. The powder was maintained in the atmosphere at a temperature of 1100° C., to be converted into the molten state. It was then put into liquid nitrogen to be cooled abruptly. The resulting lump was crushed and was pressurized and molded into the form of a disk 20 mm in diameter and 2 mm in thickness, and was placed in an alumina crucible with a cover to be heat-treated in the atmosphere for five hours at a temperature of 900° C. The resulting sintered material was analyzed by X-ray diffractometry for powder; it was confirmed that $(Tl_{0.5}Pb_{0.5})Sr_2CaCu_2O_7$ was generated, without any other material being produced. The superconductive critical temperature of this sintered material was measured by the d.c. four-terminal method, and it was found that the electric resistance reached zero at 96 K. A VSM was used to measure the B-H curve of this sintered specimen at 77 K., and the superconductive critical current density Jc flowing inside the crystal grains of the $(Tl_{0.5}Pb_{0.5})Sr_2CaCu_2O_7$ of the sintered material, based on the size of the hysteresis. The result was that the Jc value was found to be 1000 A/cm$^2$ when the applied magnetic field was 1 tesla.

Next, Sm was substituted for atoms of Ca of the oxide superconductive material $(Tl_{0.5}Pb_{0.5})Sr_2CaCu_2O_7$ to form non-superconductive material $(Tl_{0.5}Pb_{0.5})Sr_2SmCu_2O_7$.

The SrO, $Sm_2O_3$ and CuO were mixed so that the atomic ratio of Sr:Sm:Cu was 2:1:2, and the mixture was heat-treated at 900° C. for twenty hours in the atmosphere. This powder was crushed in an agate mortar, and the resulting powder was mixed with the $Tl_2O_3$ and PbO so that the atomic ratio of the Tl:Pb:Sr:Sm:Cu was 0.5:0.5:2:1:2. When the powder was mixed sufficiently in the agate mortar, it was pressurized and molded into the form of a disk 20 mm in diameter and 2 mm in thickness, and was placed in an alumina crucible with a cover, to be heat-treated in the atmosphere for five hours at a temperature of 900° C. The resulting sintered material was analyzed by X-ray diffractometry for powder; it was confirmed that $(Tl_{0.5}Pb_{0.5})Sr_2SmCu_2O_7$ was generated, without any other material being produced. The electric resistance of this sintered material was measured by the d.c. four-terminal method while changing the temperature. The electric resistance was about 10$^2$ (10 raised to second power) ohms.cm at about 300 K., with the temperature dependency being that of a semiconductor. The measurement was continued up to 4.2 K. without attaining superconductivity within that range.

Next, powder ( $Tl_{0.5}Pb_{0.5})Sr_2CaCu_2O_7$ and powder $(Tl_{0.5}Pb_{0.5})Sr_2SmCu_2O_7$ crushed in the agate mortar were mixed so that the molar ratio between ( $Tl_{0.5}Pb_{0.5})Sr_2CaCu_2O_7$ and $(Tl_{0.5}Pb_{0.5})Sr_2SmCu_2O_7$ was 9:1. They were then pressurized and molded into the form of a disk 20 mm in diameter and 2 mm in thickness, and were placed in an alumina crucible with a cover, to be heat-treated in the atmosphere for five hour at temperature of 900° C. Then the resulting sintered material was analyzed by X-ray diffractometry for powder to confirm that $(Tl_{0.5}Pb_{0.5})Sr_2CaCu_2O_7$ and $(Tl_{0.5}Pb_{0.5})Sr_2SmCu_2O_7$ were present, without any other material being produced. The superconductive critical temperature of this sintered material was measured by the d.c. four-terminal method, and it was found that the electric resistance reached zero at 95 K. A VSM was used to measure the B-H curve of this sintered specimen at 77 K. The superconductive critical current density Jc flowing inside the crystal grains of $(Tl_{0.5}Pb0.5)Sr_2CaCu_2O_7$ of the sintered material was detremined, based on the size of the hysteresis. The result was that the Jc value was found to be 13000 A/cm$^2$ when the applied magnetic field was 1 tesla. This shows that the $(Tl_{0.5}Pb_{0.5})Sr_2SmCu_2O_7$ serves as a very effective pinning center for the oxide superconductive material $(Tl_{0.5}Pb_{0.5})Sr_2CaCu_2O_7$. It was also found that use of the material passing through the amorphous state is effective to manufacture a superconductor featuring a high Jc value in a magnetic field.

Next, this sintered material was again crushed and a golden pipe of 6 mm outer diameter and 4 mm inner diameter was filled with the powder. It was then rolled to a thickness of 0.1 mm after being drawn up to the outer diameter of 0.5 mm. This was cut off into a specimen of 30 mm, which was heat-treated at the temperature of 950° C. in the atmosphere for ten hours.

The superconductive critical temperature of this specimen was measured by the d.c. four-terminal method in a magnetic field of 1 tesla at 77 K. and the Jc value was found to be 12000 A/cm$^2$. The long wire, after being rolled, was wound in a coil, and was heat-treated at a temperature of 950° C. in the atmosphere for ten hours. This coil was put into the liquid nitrogen, and an electric current was applied to it. A magnetic field of 1.0 tesla could be generated with the wire remaining superconductive.

Embodiment 20

As the starting materials, $Tl_2O_3$, PbO, SrO, CaO, CuO, and $Sm_2O_3$ with a purity of 99 percent or more were used. The SrO, CaO, CuO were mixed so that the atomic ratio of the Sr:Ca:Cu was 2:2:3 and was heat-treated in the atmosphere for twenty hours at the temperature of 900° C. This powder was crushed in an agate mortar, and the resulting powder was mixed with the $Tl_2O_3$ and PbO so that the atomic ratio of the Tl:Pb:Sr:Ca:Cu was 0.5:0.5:2:2:3. The powder was mixed sufficiently in the agate mortar and was placed in an alumina crucible with a cover, to be heat-treated at the temperature of 850° C. in the atmosphere for five hours. The resulting sintered material was analyzed by X-ray diffractometry for powder and the result was analyzed by the Rietveld method, to confirm that a superconductive material having the crystal structure shown in FIG. 3 was present with a percentage of at least 90%.

The superconductive critical temperature of this sintered material was measured by the d.c. four-terminal method, and it was found that the electric resistance reached zero at 113 K. A VSM was used to measure the B-H curve of this sintered specimen at 77 K., and the superconductive critical current density Jc flowing inside the crystal grains of $(Tl_{0.5}Pb_{0.5})Sr_2CaCu_3O_9$ of the sintered specimen, based on the size of the hysteresis. The result was that the Jc value was found to be 1000 A/cm$^2$ when the applied magnetic field was 1 tesla.

Next, Sm was substituted for atoms of Ca in the oxide superconductive material $(Tl_{0.5}Pb_{0.5})Sr_2CaCu_3O_9$ to form non-superconductive material $(Tl_{0.5}Pb_{0.5})Sr_2SmCu_3O_9$.

The SrO, CaO, $Sm_2O_3$ and CuO were mixed so that the atomic ratio of Sr:Ca:Sm:Cu was 2:1:1:3 and the mixture was heat-treated in atmosphere for twenty hours at a temperature of 900° C. This powder was crushed in an agate mortar, and resulting powder was mixed with the $Tl_2O_3$ and PbO so that the atomic ratio of the Tl:Pb:Sr:Ca:Sm:Cu was 0.5:0.5:2:1:1:3. The powder was mixed sufficiently in the agate mortar and was was pressurized and molded into the form of a disk 20 mm in diameter and 2 mm in thickness; then it was placed in an alumina crucible with a cover, to be heat-treated in the atmosphere for five hours at the temperature of 900° C. The resulting sintered material was subjected to X-ray diffractometry for powder, and the result was analyzed by the Riedweld method, to confirm that a superconductive material having the crystal structure shown in FIG. 3 was present with a percentage of at least 90%. The superconductive critical temperature of this sintered material was measured by the d.c. four-terminal method while changing the temperature. The electric resistance was about $10^2$ (10 raised to second power) ohms.cm at about 300 K., with the temperature dependency being that of a semiconductor. The measurement was continued up to 4.2 K. without attaining superconductivity within that range.

Next, powder (Tl0.5 $Pb_{0.5})Sr_2CaCu_3O_9$ and powder $(Tl_{0.5}Pb_{0.5})Sr_2SmCu_3O_9$ crushed in the agate mortar were mixed so that the molar ratio between $(Tl_{0.5}Pb_{0.5})Sr_2CaCu_3O_9$ and $(Tl_{0.5}Pb_{0.5})Sr_2SmCu_3O_9$ was 9:1. They were sufficiently mixed in the agate mortar, were pressurized and molded into the form of a disk 20 mm in diameter and 2 mm in thickness, and were placed in an alumina crucible with a cover, to be heat-treated in the atmosphere for five hours at a temperature of 900° C. Then the resulting sintered material was analyzed by X-ray diffractometry for powder to confirm that $(Tl_{0.5}Pb_{0.5})Sr_2CaCu_3O_9$ and $(Tl_{0.5}Pb_{0.5})Sr_2SmCu_2O_9$ were present, without any other material being produced. The superconductive critical temperature of this sintered material was measured by the d.c. four-terminal method, and it was found that the electric resistance reached zero at 110 K. A VSM was used to measure the B-H curve of this sintered specimen at 77 K. The superconductive critical current density Jc flowing inside the crystal grains of the sintered material was determined, based on the size of the hysteresis. The result was that the Jc value was found to be 15000 A/cm$^2$ when the applied magnetic field was 1 tesla. This shows that the $(Tl_{0.5}Pb_{0.5})Sr_2SmCu_3O_9$ serves as a very effective pinning center for the oxide superconductive material $(Tl_{0.5}Pb_{0.5})Sr_2CaCu_3O_9$.

Next, this sintered material was again crushed and a golden pipe of 6 mm outer diameter and 4 mm inner diameter was filled with the powder. It was then rolled to a thickness of 0.1 mm after being drawn up to the outer diameter of 0.5 mm. This was cut off into a specimen of 30 mm, which was heat-treated at the temperature of 950° C. in the atmosphere for ten hours.

The superconductive critical temperature of this specimen was measured by the d.c. four-terminal method in the magnetic field of 1 tesla at 77 K. and the Jc value was found to be 14000 A/cm$^2$.

Embodiment 21

As the starting materials, $Tl_2O_3$, PbO, SrO, CaO, CuO, $Sm_2O_3$ with a purity of 99 percent or more were used. The SrO, CaO, CuO were mixed so that the atomic ratio of the Sr:Ca:Cu was 2:3:4 and the mixture was heat-treated in the atmosphere for twenty hours at a temperature of 900° C. This powder was crushed in an agate mortar, and resulting powder was mixed with the $Tl_2O_3$ and PbO so that the atomic ratio of the Tl:Pb:Sr:Ca:Cu was 0.5:0.5:2:3:4. The powder was mixed in the agate mortar and was placed in an alumina crucible with a cover, to be heat-treated at a temperature of 850° C. in the atmosphere for five hours. The resulting sintered material was analyzed by X-ray diffractometry for powder. It was confirmed that $(Tl_{0.5}Pb_{0.5})Sr_2Ca_3Cu_4O_{11}$ was generated, without any other material being produced.

The superconductive critical temperature of this sintered material was measured by the d.c. four-terminal method, and it was found that the electric resistance reached zero at 110 K. A VSM was used to measure the B-H curve of this sintered specimen at 77 K. The superconductive critical current density Jc flowing inside the crystal grains of $(Tl_{0.5}Pb_{0.5})Sr_2Ca_3Cu_4O_{11}$ of the sintered material was determined, based on the size of hysteresis. The superconductive critical current density Jc flowing inside the crystal grains of $(Tl_{0.5}Pb_{0.5})Sr_2Ca_3Cu_4O_{11}$ of the sintered specimen was determined, based on the size of the hysteresis. The result was that the Jc value was found to be 900 A/cm$^2$ when the applied magnetic field was 1 tesla.

Next, Sm was substituted for atoms of Ca of the oxide superconductive material $(Tl_{0.5}Pb_{0.5})Sr_2Ca_3Cu_4O_{11}$ to form the non-superconductive material $(Tl_{0.5}Pb_{0.5})Sr_2Ca_2SmCu_4O_{11}$.

The SrO, CaO, $Sm_2O_3$ and CuO were mixed so that the atomic ratio of Sr:Ca:Sm:Cu was 2:2:1:4 and was heat-treated in the atmosphere for twenty hours at a temperature of 900° C. This powder was crushed in an agate mortar, and resulting powder was mixed with the $Tl_2O_3$ and PbO so that the atomic ratio of the Tl:Pb:Sr:Ca:Sm:Cu was 0.5:0.5:2:2:1:4. The powder was mixed sufficiently in the agate mortar and was pressurised and molded into the form of a disk 20 mm in diameter and 2 mm in thickness; then it was placed in an aluminia crucible with a cover, to be heat-treated in the atmosphere for five hours at the temperature of 900° C. The resulting sintered material was subjected to X-ray diffractometry for powder. It was confirmed that the $Sr_2Ca_3SmCu_4O_{11}$ was generated, without any other material being produced. The superconductive critical temperature of this sintered material was measured by the d.c. four-terminal method while changing the temperature. The electric resistance was about $10^2$ (10 raised to the second power) ohm-s.cm at about 300 K., with the temperature dependency being that of a semiconductor. The measurement was continued up to 4.2 K. without attaining superconductivity within that range.

Next, powder $(Tl_{0.5}Pb0.5)Sr_2Ca_3Cu_4O_{11}$ and powder $(Tl_{0.5}Pb_{0.5})Sr_2Ca_2Cu_4O_{11}$ sufficiently crushed in the agate mortar were mixed so that the molar ratio between the $(Tl_{0.5}Pb_{0.5})Sr_2Ca_3Cu_4O_{11}$ and the $(Tl_{0.5}Pb_{0.5})Sr_2Ca_2Cu_4O_{11}$ was 9:1. They were sufficiently mixed in the agate mortar, were pressurised and molded into the form of a disk 20 mm in diameter and 2 mm in thickness, and the disc was placed in an aluminia crucible with a cover, to be heat-treated in the atmosphere for five hours at a temperature of 850° C. Then the resulting sintered material was analyzed by X-ray diffractometry for powder to confirm that $(Tl_{0.5}Pb_{0.5})Sr_2Ca_3Cu_4O_{11}$ and $(Tl_{0.5}Pb_{0.5})Sr_2Ca_2Cu_4O_{11}$ were present, without any other material being produced. The superconductive critical temperature of this sintered material was measured by the d.c. four-terminal method, and the electric resistance was found to reach zero at 105 K. A VSM was used to measure the B-H curve of this sintered specimen at 77 K. The superconductive critical current density Jc flowing inside the crystal grains constituting the sintered material was determined, based on the size of the hysteresis. The result found was that the Jc value was 11000 A/cm² when the applied magnetic field was 1 tesla. This shows that the $(Tl_{0.5}Pb_{0.5})Sr_2Ca_2Cu_4O_{11}$ serves as a very effective pinning center for the oxide superconductive material $(Tl_{0.5}Pb_{0.5})Sr_2Ca_2Cu_4O_{11}$.

Next, this sintered material was again crushed and a golden pipe 6 mm in outer diameter and 4 mm in inner diameter was filled with the powder. It was then rolled to a thickness of 0.1 mm after being drawn up to the outer diameter of 0.5 mm. This was cut off into a specimen of 30 mm, which was heat treated at a temperature of 900° C. in the atmosphere for ten hours.

The superconductive critical temperature of this specimen was measured by the d.c. four-terminal method in a magnetic field of 1 tesla at 77 K., and the Jc value was found to be 11000 A/cm².

Embodiment 22

As the starting materials, $Tl_2O_3$, PbO, SrO, CaO, CuO, $Sm_2O_3$ with a purity of 99 percent or more were used. Firstly, the SrO, CaO, CuO were mixed so that the atomic ratio of the Sr:Ca:Cu was 2:2:3 and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:Ca:Cu was 0.5:0.5:2:2:3. They were mixed in the agate mortar. They were then pressurized and molded into the form of a disk 20 mm in a diameter and 2 mm in thickness, which was placed in an alumina crucible with a cover, to be heat-treated in the atmosphere for five hours at a temperature of 850° C. Then the resulting sintered material was analyzed by X-ray diffractometry for powder to confirm that $(Tl_{0.5}Pb0.5)Sr_2Ca_2Cu_3O_9$ was generated, without any other material being produced. The superconductive critical temperature of this sintered material was measured by the d.c. four-terminal method, and the electric resistance was found to reach zero at 113 K. A VSM was used to measure the B-H curve of this sintered specimen at 77 K. The superconductive critical current density Jc flowing inside the crystal grains of $(Tl_{0.5}Pb_{0.5})Sr_2CaCu_2O_7$ constituting the sintered material was determined, based on the size of the hysteresis. The result found was that the Jc value was 1000 A/cm² when the applied magnetic field was 1 tesla.

Next, this sintered material was heat-treated at a temperature of 950° C. in the atmosphere for one hour, and was cooled to room temperature. The resulting sintered material was analyzed by X-ray diffractometry for powder. It was confirmed that $Sr_2CaCu_2O_7$, CaO and CuO were generated with very few components of other phase existing.

A scanner type electronic microscope was used to observe the structure of this sintered material; crystal grains of CaO and CuO with an average particle size of several microns were separated inside and outside the crystal grains of $(Tl_{0.5}Pb_{0.5})Sr_2CaCu_2O_7$ having an average particle size of about 30 microns. The superconductive critical temperature of this sintered material was measured by the d.c. four-terminal method, and the electric resistance was found to reach zero at 94 K. A VSM was used to measure the B-H curve of this sintered specimen at 77 K. The superconductive critical current density Jc flowing inside the crystal grains constituting the sintered material was determined, based on the size of the hysteresis. The result found was that the Jc walue was 8000 A/cm² when the applied magnetic field was 1 tesla. This shows that effective pinning centers can be formed by decomposing an oxide superconductive material into another oxide superconductive material and non-superconductive material.

Next, this sintered material was again crushed and a golden pipe 6 mm in outer diameter and 4 mm in inner diameter was filled with the powder. It was then rolled to a thickness of 0.1 mm after being drawn up to the outer diameter of 0.5 mm. This was cut off into a specimen of 30 mm, which was heat-treated at a temperature of 900° C. in the atmosphere for tem hours.

The superconductive critical temperature of this specimen was measured by the d.c. four-terminal method at 77 K. in the magnetic fields of 1 tesla, and the Jc value was found to be 7000 A/cm². The long rolled wire was wound into a coil, and was heat-treated at 900° C. in the atmosphere for ten hours. This coil was then put into liquid nitrogen, and electric current was applied. A magnetic field of 0.5 tesla was formed, with the wire remaining superconductive.

Embodiment 23

As the starting materials, $Tl_2O_3$, PbO, SrO, CaO, CuO, $Sm_2O_3$ with a purity of 99 percent or more were used. Flrstly, the SrO, CaO, CuO were mixed so that the atomic ratio of the Sr:Ca:Cu was 2:1:2 and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:Ca:Cu was 0.4:0.6:2:1:2. They were mixed in the agate mortar. They were then pressurized and molded into the form of a disk 20 mm in diameter and 2 mm in thickness, which was placed in an alumina crucible with a cover, to be heat-treated in the atmosphere for five hours at a temperature of 900° C. Then the resulting sintered material was analyzed by X-ray diffractometry for powder to confirm that $(Tl_{0.4}Pb_{0.6})Sr_2CaCu_2O_7$ was generated, without any other material being produced.

The superconductive critical temperature of this sintered material was measured by the d.c. four-terminal method, and the electric resistance was found to reach zero at 93 K. A VSM was used to measure the B-H curve of this sintered specimen at 77 K. The superconductive critical current density Jc flowing inside the crystal grains of $(Tl_{0.4}Pb_{0.6})Sr_2CaCu_2O_7$ constituting the sintered material was determined, based on the size of the hysteresis. The result found was that the Jc value was 900 A/cm$^2$ when the applied magnetic field was 1 tesla.

Next, Sm was substitued for atoms of Ca in the oxide superconductive material $(Tl_{0.4}Pb_{0.6})Sr_2CaCu_2O_7$ to form the non-superconductive material $(Tl_{0.4}Pb_{0.6})Sr_2SmCu_2O_7$. SrO, $Sm_2O_3$ and CuO were mixed so that the atomic ratio of Sr:Sm:Cu was 2:1:2, and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:Sm:Cu was 0.4:0.6:2:1:2. The powder was mixed in the agate mortar and was then pressurized and molded into the form of a disk 22 mm in diameter and 2 mm in thickness; then the disc was placed in an alumina crucible with a cover, to be heat-treated in the atmosphere for five hours at a temperature of 900° C. The resulting sintered material was subjected to X-ray diffractometry for powder. It was confirmed that $(Tl_{0.4}Pb_{0.6})Sr_2SmCu_2O_7$ was generated, without any other material being produced.

The superconductive critical temperature of this sintered material was measured by the d.c. four terminal method while changing the temperature. The electric resistance was about $10^2$ (10 raised to second power) ohms.cm at about 300 K., with the temperature dependency being that of a semiconductor. The measurement was continued up to 4.2 K. without attaining superconductivity within that range.

Next, powder $(Tl_{0.4}Pb_{0.6})Sr_2CaCu_2O_7$ and powder $(Tl_{0.4}Pb_{0.6})Sr_2SmCu_2O_7$ crushed in the agate mortar were mixed so that the molar ratio between $(Tl_{0.4}Pb_{0.6})Sr_2CaCu_2O_7$ and $(Tl_{0.4}Pb_{0.6})Sr_2SmCu_2O_7$ was 9:1. They were mixed in the agate mortar, were prssurized and molded into the form of a disk 20 mm in diameter and 2 mm in thickness, and the disk was placed in an alumina crucible with a cover, to be heat-treated in the atmosphere for five hours at a temperature of 900° C. Then the resulting sintered material was analyzed by X-ray diffractometry for powder to confirm that $(Tl_{0.4}Pb_{0.6})Sr_2CaCu_2O_7$ and $(Tl_{0.4}Pb_{0.6})Sr_2SmCu_2O_7$ were present, without any other material being produced.

The superconductive critical temperature of this sintered material was measured by the d.c. four-terminal method, and the electric resistance was confirmed to reach zero at 110 K. A VSM was used to measure the B-H curve of this sintered specimen at 77 K. The superconductive critical current density Jc flowing inside the crystal grains of $(Tl_{0.4}Pb_{0.6})Sr_2CaCu_2O_7$ constituting the sintered material was determined, based on the size of the hysteresis. The result found was that the Jc value was 11000 A/cm$^2$ when the applied magnetic field was 1 tesla. This shows that the $(Tl_{0.4}Pb_{0.6})Sr_2CaCu_2O_7$ serves as a very effective pinning center for the oxide superconductive material $(Tl_{0.4}Pb_{0.6})Sr_2CaCu_2O_7$.

Next, this sintered material was crushed and mixed with powdered CaO with an average particle size of about two microns in a volume ratio of 10 to 1. The mixture was then pressurized and molded into the form of a disk 20 mm in diameter and 2 mm in thickness, and the disk was placed in an alumina crucible with a cover, to be heat-treated in the atmosphere for ten minutes at a temperature of 1050° C. The temperature was then reduced to 900° C., at which the mixture was heated for five hours. Then the resulting sintered material was analyzed by X-ray diffractometry for powder to confirm that $(Tl_{0.4}Pb_{0.6})Sr_2CaCu_2O_7$ and $(Tl_{0.4}Pb_{0.6})Sr_2SmCu_2O_7$ were present, with very few other materials being produced.

A scanner type electronic microscope was used to observe the structure of this sintered material, and traces were found which showed that the liquid phase was formed once. The superconductive critical temperature of this sintered material was measured by the d.c. four-terminal method, and the electric resistance was found to reach zero at 90 K. A VSM was used to measure the B-H curve of this sintered specimen at 77 K. The superconducive critical current density Jc flowing inside the crystal grains of the sintered material was determined, based on the size of the hysteresis. The result found was that the Jc value was 13000 A/cm$_2$ when the applied magnetic field was 1 tesla. This shows that the CaO particles are effectively working as pinning centers.

Next, this sintered material was again crushed and a golden pipe 6 mm in outer diameter and 4 mm in inner diameter was filled with the powder. It was then rolled to a thickness of 0.1 mm after being drawn up to the outer diameter of 0.5 mm. This was cut off into a specimen of 30 mm, which was heat-treated at a temperature of 1050° C. in the atmosphere for ten minutes, and again heat-treated at a reduced temperature of 900° C. for 5 hours. The superconductive critical temperature of this specimen was measured by the d.c. four-terminal method in a magnetic field of 1 tesla at 77 K., and the Jc value was found to be 13000 A/cm$^2$.

Embodiment 24

A wire specimen was manufactured under the same conditions as those used in Embodiment 17, except that SrO was used instead of the CaO used in Embodiment 17. The superconductive critical tempearture of this specimen was measured by the d.c. four-terminal method in a magnetic field of 1 tesla at 77 K., and the Jc value was found to be 12000 A/cm$^2$.

Embodiment 25

A wire specimen was manufactured under the same conditions as those used in Embodiment 17, except that $Ca_2CuO_3$ was used instead of the CaO used in Embodiment 17. The superconductive critical temperature of this specimen was measured by the d.c. four-terminal method in a magnetic field of 1 tesla at 77 K., and the Jc value was found to be 14000 A/cm$^2$.

Embodiment 26

A wire specimen was manufactured under the same conditions as those used in Embodiment 7, except that $Ca_2PbO_4$ was used instead of the CaO used in Embodiment 17. The superconductive critical temperature of this specimen was measured by the d.c. four-terminal method in a magnetic field of 1 tesla at 77 K., and the Jc value was found to be 12000 A/cm$^2$.

Embodiment 27

A wire specimen was manufactured under the same conditions as those used in Embodiment 17, except that $BaBiO_3$ was used instead of the CaO used in Embodiment 17. The superconductive critical temperature of this specimen was measured by the d.c. four-terminal method in a magnetic field of 1 tesla at 77 K., and the Jc value was found to be 12000 A/cm$^2$.

Embodiment 28

A wire specimen was manufactured under the same conditions as those used in Embodiment 17, except that ZrO$_2$ was used instead of the CaO used in Embodiment 17. The superconductive critical temperature of this specimen was measured by the d.c. four-terminal method in a magnetic field of 1 tesla at 77 K., and the Jc value was found to be 3000 A/cm$^2$.

Embodiment 29

As the starting materials, Tl$_2$O$_3$, PbO, SrO, CaO, CuO, Sm$_2$O$_3$ with a purity of 99 percent or more were used. Firstly, the SrO, CaO, CuO were mixed so that the atomic ratio of the Sr:Ca:Cu was 2:1:2 and the mixture was heat-treated in the atmosphere for twenty hours at a temperature of 900° C. This powder was crushed in an agate mortar, and the resulting powder was mixed with the Tl$_2$O$_3$, and PbO so that the atomic ratio of the Tl:Pb:Sr:Ca:Cu was 0.5:0.5:2:1:2. They were mixed in the agate mortar. They were then pressurized and molded into the form of a disk 20 mm in diameter and 2 mm in thickness. The disk was placed in an alumina crucible with a cover, to be heat-treated in the atmosphere for five hours at a temperature of 900° C. Then the resulting sintered material was analyzed by X-ray diffractometry for powder to confirm that (Tl$_{0.5}$Pb$_{0.5}$)Sr$_2$CaCu$_2$O$_7$ was generated, without any other material being produced.

The superconductive critical temperature of this sintered material was measured by the d.c. four-terminal method, and the electric resistance was found to reach zero at 95 K. A VSM was used to measure the B-H curve of this sintered specimen at 77 K. The superconductive critical current density Jc flowing inside the crystal grains of (Tl$_{0.5}$Pb$_{0.5}$)Sr$_2$CaCu$_2$O$_7$ constituting the sintered material was determined, based on the size of the hysteresis. The result found was that the Jc value was 900 A/cm$^2$ when the applied magnetic field was 1 tesla.

Next, Sm was substituted for atoms of Ca in the oxide superconductive material (Tl$_{0.5}$Pb$_{0.5}$)Sr$_2$CaCu$_2$O$_7$ to form the non-superconductive material (Tl$_{0.5}$Pb$_{0.5}$)Sr$_2$CaCu$_2$O$_7$. SrO, Sm$_2$O$_3$ and CuO were mixed so that the atomic ratio of Sr:Sm:Cu was 2:1:2, and the mixture was heat-treated in the atmosphere for twenty hours at a temperature of 900° C. This powder was crushed in an agate mortar, and the resulting powder was mixed with the Tl$_2$O$_3$ and PbO so that the atomic ratio of the Tl:Pb:Sr:Sm:Cu was 0.5:0.5:2:1:2. The powder was mixed in the agate mortar and was then pressurized and molded into the form of a disk 20 mm in diameter and 2 mm in thickness; then the disk was placed in an alumina crucible with a cover, to be heat-treated in the atmosphere for five hours at a temperature of 900° C. The resulting sintered material was subjected to X-ray diffractometry for powder. It was confirmed that (Tl$_{0.5}$Pb$_{0.5}$)Sr$_2$SmCu$_2$O$_7$ was produced, without any other material being produced.

The electric resistance of this sintered material was measured by the d.c. four-terminal method while changing the temperature. The electric resistance was about 10$^2$ (10 raised to second power) ohms.cm at about 300 K., with the temperature dependency being that of a semiconductor. The measurement was continued up to 4.2 K. without attaining superconductivity within that range.

Next, powder (Tl$_{0.5}$Pb$_{0.5}$)Sr$_2$CaCu$_2$O$_7$ and powder (Tl$_{0.5}$Pb$_{0.5}$)Sr$_2$SmCu$_2$O$_7$ crushed in the agate mortar were mixed so that the molar ratio between the (Tl$_{0.5}$Pb$_{0.5}$)Sr$_2$CaCu$_2$O$_7$ and (Tl$_{0.5}$Pb$_{0.5}$)Sr$_2$SmCu$_2$O$_7$ had different values 1:X (where the value of X was changed). They were mixed in the agate mortar, were then pressurized and molded into the form of a disk 20 mm in diameter and 2 mm in thickness, and the disk was placed in an alumina crucible with a cover, to be heat-treated in the atmosphere for five hours at a temperature of 900° C.

The superconductive critical temperature of this sintered material was measured by the d.c. four-terminal method, and the electric resistance was found to reach zero at 110 K. A VSM was used to measure the B-H curve of this sintered specimen at 77 K. The superconductive critical current density Jc flowing inside the crystal grains constituting the sintered material was determined, based on the size of the hysteresis. The superconductive critical field densities were determined when one tesla of magnetic field was applied, and the results are shown in the following Table, with the value obtained shown as "Jc":

| VALUE OF X | Tc | Jc |
|---|---|---|
| 0 | 95 | 900 |
| 0.0001 | 95 | 950 |
| 0.0005 | 95 | 3000 |
| 0.01 | 95 | 5000 |
| 0.05 | 95 | 7000 |
| 0.10 | 95 | 12000 |
| 0.50 | 93 | 11000 |
| 1.0 | 93 | 8000 |
| 5.0 | 93 | 4000 |
| 10.0 | 89 | 100 |

Embodiment 30

As the starting materials, Tl$_2$O$_3$, PbO, SrO, CaO, CuO and rare earth elements with a purity of 99 percent or more were used. Firstly, a oxide superconductive material was produced, in the same way as for Embodiment 17.

Next, a rare earth was substituted for atoms of Ca in the oxide superconductive material (Tl$_{0.5}$Pb$_{0.5}$)Sr$_2$CaCu$_2$O$_7$ to form the non-superconductive material (Tl$_{0.5}$Pb$_{0.5}$)Sr$_2$LnCu$_2$O$_7$ (where Ln is a rare earth). The SrO rare earth oxide and CuO were mixed so that the atomic ratio of Sr:Ln:Cu was 2:1:2, and the mixture was heat-treated in the atmosphere for twenty hours at a temperature of 900° C. This powder was crushed in an agate mortar, and the resulting powder was mixed with the Tl$_2$O$_3$ and PbO so that the atomic ratio of the Tl:Pb:Sr:Ln:Cu was 0.5:0.5:2:1:2. The powder was mixed in the agate mortar and was pressurized and molded into the form of a disk 20 mm in diameter and 2 mm in thickness; then the disk was placed in an alumina crucible with a cover, to be heat-treated in the atmosphere for five hours at a temperature of 900° C. The resulting sintered material was subjected to X-ray diffractometry for powder. It was confirmed that 90 percent or more of the products were occupied by the (Tl$_{0.5}$Pb$_{0.5}$)Sr$_2$LnCu$_2$O$_7$ in all specimens.

These sintered materials were measured by the d.c. four-terminal method while changing the temperature. The electric resistance was about 10$^2$ (10 raised to second power) ohms.cm at about 300 K., with the temperature dependency being that of a semiconductor. The measurement was continued up to 4.2 K. without attaining superconductivity within that range.

Next, powder $(Tl_{0.5}Pb_{0.5})Sr_2CaCu_2O_7$ and powder $(Tl_{0.5}Pb_{0.5})Sr_2LnCu_2O_7$ crushed in the agate mortar were mixed so that the molar ratio between $(Tl_{0.5}Pb_{0.5})Sr_2CaCu_2O_7$ and $(Tl_{0.5}Pb_{0.5})Sr_2LnCu_2O_7$ was 9:1. They were mixed in the agate mortar, were then pressurized and molded into the form of a disk 20 mm in diameter and 2 mm in thickness, and the disk was placed in an alumina crucible with a cover, to be heat-treated in the atmosphere for five hours at a temperature of 900° C. The superconductive critical temperature of this sintered material was measured by the d.c. four-terminal method. Assuming the temperature at which the electric resistance reached zero to be "Tc", a VSM was used to measure the B-H curve of this sintered specimen at 77 K.

The superconductive critical current density flowing inside the crystal grains constituting the sintered material was determined, based on the size of the hysteresis. The superconductive critical current density Jc when the applied magnetic current density was 1 Tesla, and the results are shown in the following Table, which illustrates that the $(Tl_{0.5}Pb_{0.5})Sr_2CaCu_2O_7$ works very effectively as a pinning center for the oxide superconductive material $(Tl_{0.5}Pb_{0.5})Sr_2CaCu_2O_7$. It also illustrates that there is not much difference among the rare earth elements.

| RARE EARTH ELEMENT | Tc | Jc |
|---|---|---|
| T | 92 | 11000 |
| La | 93 | 10000 |
| Pr | 91 | 9000 |
| Nd | 92 | 8000 |
| PM | 95 | 9000 |
| Sm | 95 | 12000 |
| Eu | 93 | 10000 |
| Gd | 94 | 8000 |
| Tb | 92 | 9000 |
| Dy | 83 | 11000 |
| Ho | 96 | 13000 |
| Er | 98 | 9000 |
| Tm | 96 | 11000 |
| Yb | 91 | 10000 |
| Lu | 92 | 12000 |

Embodiment 31

As the starting materials, $Tl_2O_3$, PbO, SrO, CaO, CuO and $Sm_2O_3$ were used. Firstly, oxide superconductive materials were produced, with a variety of mixing ratios between Tl and Pb.

The SrO, CaO and CuO were mixed so that the atomic ratio of Sr:Ca:Cu was 2:1:2, and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:Ca:Cu was (1-X):X:2:1:2 (where the value of X was varied to produce superconductive materials with different percentages of Tl and Pb). They were mixed in the agate mortar, were then pressurized and molded into the form of a disk 20 mm in a diameter and 2 mm in thickness. The disk was placed in an alumina crucible with a cover, to be heat-treated in the atmosphere for five hours at a temperature of 900° C.

Next, La was substituted for atoms of Ca in the oxide superconductive material $(Tl_{1-x}Pb_x)Sr_2CaCu_2O_7$ to form the non-superconductive material $(Tl_{1-x}Pb_x)Sr_2LaCu_2O_7$. The SrO, $La_2O_3$ and CuO were mixed so that the atomic ratio of Sr:La:Cu was 2:1:2, and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:Ln:Cu was X-1:X:2:1:2. The powder was mixed in the agate mortar and was then pressurised and molded into the form of a disk 20 mm in diameter and 2 mm in thickness; then the disk was placed in an alumina crucible with a cover, to be heat-treated in the atmosphere for five hours at a temperature of 900° C. The electric resistance of the resulting sintered material was measured by the d.c. four-terminal method while changing the temperature. The electric resistance was about $10^2$ (10 raised to second power) ohms.cm at about 300 K., with the temperature dependency being that of a semiconductor. The measurement was continued up to 4.2 K. without attaining superconductivity within that range.

Next, powder $(Tl_{1-x}Pb_x)Sr_2CaCu_2O_7$ and powder $(Tl_{1-x}Pb_x)Sr_2LaCu_2O_7$ crushed in the agate mortar were mixed so that the molar ratio between the $(Tl_{1-x}Pb_x)Sr_2CaCu_2O_7$ and $(Tl_{1-x}Pb_x)Sr_2LaCu_2O_7$ was 9:1. They were mixed in the agate mortar, were then pressurized and molded into the form of a disk 20 mm in diameter and 2 mm in thickness, and the disk was placed in an alumina crucible with a cover, to be heat-treated in the atmosphere for five hours at a temperature of 900° C.

The superconductive critical temperature of this sintered material was measured by the d.c. four-terminal method. Assuming the temperature at which the electric resistance reached zero was "Tc", a VSM was used to measure the B-H curve of this sintered specimen at 77 K. The superconductive critical current density flowing inside the crystal grains constituting the sintered material was determined, based on the size of the hysteresis. The superconductive critical current density Jc was determined when the applied magnetic current density was 1 Tesla, and the results are shown in the following Table, which illustrates that the $(Tl_{1-x}Pb_x)Sr_2CaCu_2O_7$ works very effectively as a pinning center for the oxide superconductive material $(Tl_{1-x}Pb_x)Sr_2CaCu_2O_7$. It also illustrates that there are differences in the performance of the superconductor according to the percentages of the Tl and Pb contained therein; the values of X should be within a certain range.

| VALUE OF X | Tc | Jc |
|---|---|---|
| 0.0 | — | 0 |
| 0.1 | 82 | 2000 |
| 0.2 | 89 | 7000 |
| 0.3 | 93 | 9000 |
| 0.4 | 95 | 12000 |
| 0.5 | 93 | 10000 |
| 0.6 | 96 | 13000 |
| 0.7 | 90 | 9000 |
| 0.8 | 83 | 6000 |
| 0.9 | 80 | 1000 |
| 1.0 | — | 0 |

Embodiment 32

As the starting materials, $Tl_2O_3$, PbO, $Bi_2O_3$, SrO, CaO, CuO and $La_2O_3$ were used. Firstly, oxide superconductive materials were produced with various mixing ratios of Tl and Pb. The SrO, CaO and CuO were mixed so that the atomic ratio of Sr:Ca:Cu was 2:1:2, and the mixture was heat-treated in the atmosphere for twenty hours at a temperature of 900° C. This powder was crushed in an agate mortar, and the resulting powder was mixed with the $Tl_2O_3$, PbO and $Bi_2O_3$ so that the atomic ratio of the Tl:Pb:Bi:Sr:Ca:Cu was 0.4:(0.6-X):X:2:1:2 (where the value of X was varied to produce superconductive materials with different percentages of the Tl, Pb and Bi). They were mixed in the agate mortar, were then pressurized and molded into the form of a disk 20 mm in diameter and 2 mm in thickness, and the disk was placed in an alumina crucible with a cover, to be heat-treated in the atmosphere for five hours at a temperature of 900° C.

Next, La was substituted for atoms of Ca in the oxide superconductive material $(Tl_{0.4}Pb_{0.6-x}Bi_x)Sr_2CaCu_2O_7$ to form the non-superconductive material $(Tl_{0.4}Pb_{0.6-x}Bi_x)Sr_2LaCu_2O_7$. The SrO, $La_2O_3$ and CuO were mixed so that the atomic ratio of Sr:La:Cu was 2:1:2, and the mixture was heat-treated in the atmosphere for twenty hours at a temperature of 900° C. This powder was crushed in an agate mortar, and the resulting powder was mixed with the $Tl_2O_3$, PbO and $Bi_2O_3$ so that the atomic ration of the Tl:Pb:Bi:Sr:La:Cu was 0.4:(0.6-X):X:2:1:2. They were mixed in the agate mortar, were pressurized and molded into the form of a disk 20 mm in diameter and 2 mm in thickness, and the disk was placed in an alumina crucible with a cover, to be heat-treated in the atmosphere for five hours at a temperature of 900° C. The electric resistance of this sintered material was measured by the d.c. four-terminal method while changing the temperature. The electric resistance was about $10^2$ (10 raised to second power) ohms.cm at about 300 K., with the temperature dependency being that of a semiconductor. The measurement was continued up to 4.2 K. without attaining superconductivity within that range.

Next, powder $(Tl_{0.4}Pb_{0.6-x}Bi_x)Sr_2CaCu_2O_7$ and $(Tl_{0.4}Pb_{0.6-x}Bi_x)Sr_2LaCu_2O_7$ crushed in the agate mortar were mixed so that the molar ratio of the $(Tl_{0.5}Pb_{0.6-x}Bi_x)Sr_2CaCu_2O_7$ and $(Tl_{0.4}Pb_{0.6-x}Bi_x)Sr_2LaCu_2O_7$ was 9:1. They were mixed in the agate mortar, were pressurized and molded into the form of a disk 20 mm in diameter and 2 mm in thickness, and the disk was placed in an alumina crucible with a cover, to be heat-treated in the atmosphere for five hours at a temperature of 900° C. The superconductive critical temperature of this sintered material was measured by the d.c. four-terminal method. Assuming the temperature at which electric resistance reached zero was "Tc", a VSM was used to measure the B-H curve of this sintered specimen at 77 K. The superconductive critical current density flowing inside the crystal grains constituting the sintered material was determined, based on the size of the hysteresis. The superconductive critical current density Jc was found when the applied magnetic current density was 1 Tesla, and the results are shown in the following Table, which illustrates that the $(Tl_{0.4}Pb_{0.6-x}Bi_x)Sr_2LaCu_2O_7$ works very effecitvely as a pinning center for the oxide superconductive material $(Tl_{0.4}Pb_{0.5-x}Bi_x)Sr_2CaCu_2O_7$. It also shows that there are differences in the performance of the superconductor according to the percentage of the Tl, Pb and Bi contained therein; the values of X should be within a certain range.

| VALUE OF X | Tc | Jc |
| --- | --- | --- |
| 0.0 | 96 | 14000 |
| 0.1 | 97 | 13000 |
| 0.2 | 92 | 9000 |
| 0.3 | 90 | 7000 |
| 0.4 | 88 | 5000 |
| 0.5 | 86 | 3000 |
| 0.6 | 72 | 0 |

Embodiment 33

As the starting materials, $Tl_2O_3$, PbO, SrO, BaO, CaO, CuO, $Sm_2O_3$ were used. Firstly, the SrO, BaO, CaO, and CuO were mixed so that the atomic ratio of Sr, Ca, Ca, Cu, was 2(1-X):2X:1:2, and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:Ba:Ca:Cu was 0.5:(0.5-X):2(1-X):2X:1:2. They were mixed in the agate mortar, were pressurized and molded into the form of a disk 20 mm in diameter and 2 mm in thickness, and the disk was placed in an alumina crucible with a cover to be heat-treated in the atmosphere for five hours at a temperature of 900° C. The resulting sintered material was subjected to X-ray diffractometry for powder. It was confirmed that the majority (90 percent or more) of the products were $(Tl_{0.5}Pb_{0.5-x})(Sr_{1-x}Ba_x)_2CaCu_2O_7$ with very few other products.

Next, Sm was substituted for atoms of Ca in the oxide superconductive material $(Tl_{0.5}Pb_{0.5})(Sr_{1-x}Ba_x)_2CaCu_2O_7$ to form the non-superconductive material $(Tl_{0.5}Pb_{0.5})(Sr_{1-x}Ba_x)_2SmCu_2O_7$.

The SrO, BaO and CuO were mixed so that the atomic ratio of Sr:Ba:Sm:Cu was 2(1-X):2X:1:2, and the mixture was heat-treated in the atmosphere for twenty hours at a temperature of 900° C. This powder was crushed in an agate mortar, and the resulting powder was mixed with the $Tl_2O_3$ and PbO so that the atomic ratio of the Tl:Pb:Sr:SM:Cu was 0.5:0.5:2(1-X):2X:1:2. They were mixed in the agate mortar, were pressurized and molded into the form of a disk 20 mm in diameter and 2 mm in thickness, and the disk was placed in an alumina crucible with a cover, to be heat-treated in the atmosphere for five hours at a temperature of 900° C. The resulting sintered material was subjected to X-ray diffractometry for powder. It was confirmed that $(Tl_{0.5}Pb_{0.5})(Sr_{1-x}Ba_x)_2SmCu_2O_7$, was produced, without any other material being produced.

The electric resistance of this sintered material was measured by the d.c. four-terminal method while changing the temperature. The electric resistance was about $10^2$ (10 raised to second power) ohms.cm at about 300 K., with the temperature dependency being that of a semiconductor. The measurement was continued up to 4.2 K. without attaining superconductivity within that range.

Next, powder $(Tl_{0.5}Pb_{0.5})(Sr_{1-x}Ba_x)_2CaCu_2O_7$ and $(Tl_{0.5}Pb_{0.5})(Sr_{1-x}Ba_x)_2SmCu_2O_7$ crushed in the agate mortar were mixed so that the molar ratio between the $(Tl_{0.5}Pb_{0.5})(Sr_{1-x}Ba_x)_2$ $SrCa_2O_7$ and $(Tl_{0.5}Pb_{0.5})(Sr_{1-x}Ba_x)_2SmCu_2O_7$ was 9:1. They were mixed in the agate mortar, were pressurized and molded into the form of a disk 20 mm in diameter and 2 mm in thickness, and the disk was placed in an aluminia crucible with a cover, to be heat-treated in the atmosphere for five hours at a temperature of 900° C.

The superconductive critical temperature of this sintered material was measured by the d.c. four-terminal method. Assuming the temperature at which the electric resistance reached zero was "Tc", a VSM was used to measure the B-H curve of this sintered specimen at 77 K. The superconductive critical current density flowing inside the crystal grains constituting the sintered material was determined, based on the size of the hysteresis. The superconductive critical current density Jc was determined when the applied magnetic current density was 1 Tesla, and the results are shown in the following Table, which illustrates that the $(Tl_{0.5}Pb_{0.5})(Sr_{1-x}Ba_x)_2SmCu_2O_7$ works very effectively as a pinning center for the oxide superconductive material $(Tl_{0.5}Pb_{0.5})(Sr_{1-x}Ba_x)_2CaCu_2O_7$. It is also illustrates that Jc value of the superconductor in a magnetic field is not sensitive to the percentage of the Sr and Ba contained therein.

| VALUE OF X | Tc | Jc |
|---|---|---|
| 0.0 | 95 | 12000 |
| 0.1 | 95 | 11000 |
| 0.2 | 96 | 11000 |
| 0.3 | 97 | 12000 |
| 0.4 | 97 | 13000 |
| 0.5 | 96 | 11000 |
| 0.6 | 96 | 11000 |
| 0.7 | 97 | 10000 |
| 0.8 | 98 | 12000 |
| 0.9 | 98 | 9000 |
| 1.0 | 98 | 10000 |

Embodiment 34

The sintered material of the semiconductor produced in Embodiment 18 was cooled and made superconductive, and was floated on a magnet made of samarium cobalt magnet available on the market. A weight of 30 grams was placed thereon, and the floating height was found to be approximately 5 mm, showing that the material can be used effectively for transportation systems and bearings.

Embodiment 35

FIG. 6 represents the construction of a superconductive wire according to examples of the present invention. The wire has superconductor 16 coated with an alloy coating material 17 of gold and 5 percentage-by-weight palladium, having a flat shape. The coating material 17 may be of any metal so long as it does not react significantly with the superconductor; gold, silver, palladium, copper/aluminium alloy and nickel are preferred.

A sintered specimen of the superconductor produced in Embodiment 33 was crushed, put into an alloy pipe of gold and 5 weight percent of palladium, the pipe being 100 mm in length, 6 mm in outer diameter and 5 mm in inner diameter. The pipe was sealed and was then drawn to an outer diameter of 1 mm by a draw-bench, and the wire thus produced was further rolled by a cold rolling machine to obtain a wire with a flat sectional structure having a width of 3 mm and thickness of 0.2 mm. The wire was cut into a length of 250 mm, and was placed and kept in the atmosphere at 950°. After part of the wire was molten, it was placed into liquid nitrogen to be quenched. After that, the wire was heat-treated at 880° C. for twenty hours. The critical current density of the specimen was measured by the d.c. four terminal method at 77 K. in the magnetic field of one tesla, with the result being found to be 11000 A/cm$_2$. An electron microscope was used to observe the orientation of the superconductive crystals, which revealed that approximately fifty percent of the C-axes of the crystals faced toward the direction of thickness.

The present invention may thus provide a superconductor, a superconductive wire and a superconductive magnet using oxide superconductive material of high superconductive critical current density even in a high intensity of magnetic field, which are driven by cooling of not only liquid helium but also liquid nitrogen.

What is claimed is:

1. A superconductive body comprising at least one superconductive material selected from the group consisting of:

I. $(Tl_{1-X1-X2}Pb_{X1}Bi_{X2})_\alpha(Sr_{1-X3}Ba_{X3})_{2\beta}Ca_{2\gamma}Cu_{3\delta}O_\zeta$ where
   $0 \leq X1 \leq 0.8$
   $0 \leq X2 \leq 0.5$
   $0 \leq X3 \leq 1.0$
   $0.7 \leq \alpha \leq 1.5$
   $0.7 \leq \beta \leq 1.5$
   $0.7 \leq \gamma \leq 1.5$
   $0.7 \leq \delta \leq 1.5$
   $6.0 \leq \zeta \leq 14.0$
   $0 < X1+X2 < 0.6$, II. $(Tl_{1-X1-X2}Pb_{X1}Bi_{X2})_\alpha(Sr_{1-X3}Ba_{X3})_{2\beta}Ca_\gamma Cu_{2\delta}O_{7\zeta}$ where
   $0 \leq X1 \leq 0.8$
   $0 \leq X2 \leq 0.5$
   $0 \leq X3 \leq 1.0$
   $0.7 \leq \alpha \leq 1.5$
   $0.7 \leq \beta \leq 1.5$
   $0.7 \leq \gamma \leq 1.5$
   $0.7 \leq \delta \leq 1.5$
   $4.5 \leq \zeta \leq 11.0$
   $0 < X1+X2 < 0.6$, and III. $(Tl_{1-X1-X2}Pb_{X1}Bi_{X2})_\alpha(Sr_{1-X3}Ba_{X3})_{2\beta}Ca_{3\gamma}Cu_{4\delta}O_\zeta$ where
   $0 \leq X1 \leq 0.8$
   $0 \leq X2 \leq 0.5$
   $0 \leq X3 \leq 1.0$
   $0.7 \leq \alpha \leq 1.5$
   $0.7 \leq \beta \leq 1.5$
   $0.7 \leq \gamma \leq 1.5$
   $0.7 \leq \delta \leq 1.5$
   $7.4 \leq \zeta \leq 17.0$
   $0 < X1+X2 < 0.6$, and containing at least one non-superconductive material including an oxide of at least one element selected from the group consisting of elements in said superconductive material; said at least one non-superconductive material providing pinning centers within the superconductive body; said superconductive body exhibiting a Jc of at least 10,000 A/cm$^2$ under a magnetic field of 1 Tesla at 77 K.

2. A superconductive body according to claim 1, wherein:
   $0.3 \leq X1 \leq 0.6$
   $0 \leq X2 \leq 0.2$
   $0.1 \leq X3 \leq 0.5$ 3. A superconductive body according to claim 1, wherein said at least one non-superconductive material is selected from the group consisting of SrO, CuO, $Cu_2PbO_4$, $BaPbO_3$, $BaBiO_3$, $(Ca,Sr)_2CuO_3$ and $(Ca,Sr) CuO_x$.

4. A superconductive body according to claim 1, wherein said at least one superconductive material forms a plurality of grains of said body, and said at least one non-superconductive material is present within the individual grain of the superconductive material.

5. A superconductive body according to claim 1, wherein said at least one superconductive material forms a plurality of grains of said body, and said at least one non-superconductive material is present outside of said grain of the superconductive material.

6. A superconductive body according to claim 1, wherein said at least one superconductive material forms a plurality of grains of said body, and at least 50% of said plurality of grains have the crystal C-axis orientation thereof in a predetermined direction.

7. A superconductive body according to claim 1, wherein said at least one non-superconductive material forms a a part of grains of said body, and the grains of said non-superconductive material have an average size of 1 nm to 1 μm.

8. A superconductive body according to claim 1 wherein the ratio by volume of said at least one non-superconductive material and said at least one superconductive material is 0.01 to 10.

9. A superconductive body according to claim 1, wherein the average spacing between particles of said non-superconductive material is from 1 nm to 1 μm.

10. A superconductive body according to claim 1, also including at least one metallic material having normal electrical conductivity.

11. A superconductive body according to claim 10, wherein said metallic material is selected from the group consisting of Ag, Au and Pt group metals.

12. A superconductive body comprising an oxide superconductive material of the formula: $(Tl_{1-x1-x2}Pb_{x1}Bi_{x2})(Sr_{1-x3}Ba_{x3})_2CaCu_2O_{7+x4}$, where $0 \leq X1 < 0.8$, $0 \leq X2 < 0.5$, $0 < X3 \leq 1$, $0 < X1+X2 < 1$, and $-0.5 < X4 < 0.5$) having a crystalline structure and a non-superconductive material of at least one of $(Tl_{1-x1-x2}Pb_{x1}Bi_{x2})(Sr_{1-x3}Ba_{x3})_2LnCu_2O_{7+x4}$, (where Ln is yttrium or one or more of the elements selected from the rare earth elements, and $-0.5 < X4 < 0.5$) and $(Tl_{1-x1-x2}Pb_{x1}Bi_{x2})LnSrCaCu_2O_{7+x4}$, (where Ln is yttrium or one or more of the elements selected from the rare earth elements, and $-0.5 < X4 < 0.5$) having a crystalline structure isostructural with that of said superconductive material and providing pinning centers within the superconductive body; said body exhibiting a Jc of at least 10,000 A/cm² under a magnetic field of 1 Tesla at 77 K.

13. A superconductive body comprising, (1) an oxide superconductive material of the formula: $(Tl_{1-x1-x2}Pb_{x1}Bi_{x2})(Sr_{1-x3}Ba_{x3})_2CaCu_2O_{7+x4}$, (where $0 \leq X1 < 0.8$, $0 \leq X2 < 0.5$, $0 < X3 \leq 1$, $0 < X1+X2 < 1$, and $-0.5 < X4 < 0.5$), having a crystalline structure (2) a non-superconductive material being at least one of $(Tl_{1-x1-x2}Pb_{x1}Bi_{x2})(Sr_{1-x3}Ba_{x3})LnCu_2O_{7+x4}$, (where Ln is yttrium or one or more of the elements selected from the rare earth elements, with $-0.5 < X4 < 0.5$) and $(Tl_{1-x1-x2}Pb_{x1}Bi_{x2})LnSrCaCu_2O_{7+x4}$, (where Ln is yttrium or one or more of the elements selected from the rare earth elements, with $-0.5 < X4 < 0.5$) having a crystalline structure isostructural with that of said superconductive material and providing pinning centers within the superconductive body, and (3) a part of metal; said superconutive body exhibiting a Jc of at least 10,000 A/cm² under a magnetic field of 1 Tesla at 77 K.

14. A superconductive body containing both a superconductive material selected from the group consisting of:

$(Tl_{1-x1-x2}Pb_{x1}Bi_{x2})_\alpha(Sr_{1-x3}Ba_{x3})_{2\beta}Ca_{2\gamma}Cu_{3\delta}O_\zeta$ where
 $0 \leq X1 \leq 0.8$
 $0 \leq X2 \leq 0.5$
 $0 \leq X3 \leq 1.0$
 $0.7 \leq \alpha \leq 1.5$
 $0.7 \leq \beta \leq 1.5$
 $0.7 \leq \gamma \leq 1.5$
 $0.7 \leq \delta \leq 1.5$
 $6.0 \leq \zeta \leq 14.0$
 $0 < X1+X2 < 1$ II. $(Tl_{1-x1-x2}Pb_{x1}Bi_{x2})_\alpha(Sr_{1-x3}Ba_{x3})_\beta Ca_\gamma Cu_{2\delta}O_\zeta$ where
 $0 \leq X1 \leq 0.8$
 $0 \leq X2 \leq 0.5$
 $0 \leq X3 \leq 1.0$
 $0.7 \leq \alpha \leq 1.5$
 $0.7 \leq \beta \leq 1.5$
 $0.7 \leq \Theta \leq 1.5$
 $0.7 \leq \gamma \leq 1.5$
 $4.5 \leq \zeta \leq 11.0$
 $0 < X1+X2 < 1$, III. $(Tl_{1-x1-x2}Pb_{x1}Bi_{x2})_\alpha(Sr_{1-x3}Ba_{x3})_{2\beta}Ca_{3\gamma}Cu_{4\delta}O_\zeta$ where
 $0 \leq X1 \leq 0.8$
 $0 \leq X2 \leq 0.5$
 $0 \leq X3 \leq 1.0$
 $0.7 \leq \alpha \leq 1.5$
 $0.7 \leq \beta \leq 1.5$
 $0.7 \leq \gamma \leq 1.5$
 $0.7 \leq \delta \leq 1.5$
 $7.4 \leq \zeta \leq 17.0$
 $0 < X1+X2 < 1$, and the non-superconductive material selected from the group consisting of:

I. $(Tl_{1-x1-x2}Pb_{x1}Bi_{x2})_\alpha(Sr_{1-x3}Ba_{x3})_{2\beta}Ln_\gamma Cu_{3\delta}O_\zeta$ where
 $0 \leq X1 \leq 0.8$
 $0 \leq X2 \leq 0.5$
 $0 \leq X3 \leq 1.0$
 $0.7 \leq \alpha \leq 1.5$
 $0.7 \leq \beta \leq 1.5$
 $0.7 \leq \gamma \leq 1.5$
 $0.7 \leq \delta \leq 1.5$
 $6.0 \leq \zeta \leq 14.0$
 $0 < X1+X2 < 1$
 Ln: Y, Pr, Nd, Pm, Sm, Eu, Gd, Tb, Dy, Ho, Er, Tm, Yb and Lu II. $(Tl_{1-x1-x2}Pb_{x1}Bi_{x2})_\alpha(Sr_{1-x3}Ba_{x3})_{2\beta}Ln_\gamma Cu_{2\delta}O_\zeta$ where
 $0 \leq X1 \leq 0.8$
 $0 \leq X2 \leq 0.5$
 $0 \leq X3 \leq 1.0$
 $0.7 \leq \alpha \leq 1.5$
 $0.7 \leq \beta \leq 1.5$
 $0.7 \leq \gamma \leq 1.5$
 $0.7 \leq \delta \leq 1.5$
 $4.5 \leq \zeta \leq 11.0$
 $0 < X1+X2 < 1$, and Ln: Y, Pr, Nd, Pm, Sm, Eu, Gd, Tb, Dy, Ho, Er, Tm, Yb and Lu III. $(Tl_{1-x1-x2}Pb_{x1}Bi_{x2})_\alpha(Sr_{1-x3}Ba_{x3})_{2\beta}Ln_{3\gamma}Cu_{4\delta}O_\zeta$ where
 $0 \leq X1 \leq 0.8$
 $0 \leq X2 \leq 0.5$
 $0 \leq X3 \leq 1.0$
 $0.7 \leq \alpha \leq 1.5$
 $0.7 \leq \beta \leq 1.5$
 $0.7 \leq \gamma \leq 1.5$
 $0.7 \leq \delta \leq 1.5$
 $7.4 \leq \zeta \leq 17.0$
 $0 < X1+X2 < 1$, Ln: Y, Pr, Nd, Pm, Sm, Eu, Gd, Tb, Dy, Ho, Er, Tm, Yb and Lu;

said non-superconductive material providing pinning centers within the superconductive body and said body having a Jc of at least 10,000 A/cm² under a magnetic field of 1 Tesla at 77 K.

15. A superconductive composite according to claim 14, wherein said non-superconductive material is isostructural with said superconductive material.

* * * * *